(12) United States Patent
Popp et al.

(10) Patent No.: US 9,825,247 B2
(45) Date of Patent: Nov. 21, 2017

(54) OPTOELECTRONIC COMPONENT, METHOD FOR OPERATING AN OPTOELECTRONIC COMPONENT, AND METHOD FOR PRODUCING AN OPTOELECTRONIC COMPONENT

(71) Applicant: OSRAM OLED GmbH, Regensburg (DE)

(72) Inventors: Michael Popp, Freising (DE); Dieter Musa, Wenzenbach (DE)

(73) Assignee: OSRAM OLED GmbH, Regensburg (DE)

( * ) Notice: Subject to any disclaimer, the term of this patent is extended or adjusted under 35 U.S.C. 154(b) by 33 days.

(21) Appl. No.: 15/034,887

(22) PCT Filed: Nov. 5, 2014

(86) PCT No.: PCT/EP2014/073832
§ 371 (c)(1),
(2) Date: May 6, 2016

(87) PCT Pub. No.: WO2015/067664
PCT Pub. Date: May 14, 2015

(65) Prior Publication Data
US 2016/0285032 A1    Sep. 29, 2016

(30) Foreign Application Priority Data
Nov. 7, 2013  (DE) .................. 10 2013 112 253

(51) Int. Cl.
*H01L 51/52* (2006.01)
*H01L 51/44* (2006.01)
*H01L 51/56* (2006.01)

(52) U.S. Cl.
CPC ........ *H01L 51/5203* (2013.01); *H01L 51/441* (2013.01); *H01L 51/5221* (2013.01);
(Continued)

(58) Field of Classification Search
None
See application file for complete search history.

(56) References Cited

U.S. PATENT DOCUMENTS 7,940,340 B2 * 5/2011 Ludwig .................. B42D 25/29
349/1
9,680,129 B2 * 6/2017 Kuroki ................ H01L 51/5268
(Continued)

FOREIGN PATENT DOCUMENTS

DE 102008019048 A1 10/2009
DE 102008035559 A1 2/2010
(Continued)

OTHER PUBLICATIONS

International Search Report based on Application No. PCT/EP2014/073832 (5 Pages) dated Feb. 23, 2015 (Reference Purpose Only).
(Continued)

*Primary Examiner* — Michael Lebentritt
(74) *Attorney, Agent, or Firm* — Viering, Jentschura & Partner mbB

(57) ABSTRACT

In various embodiments, an optoelectronic component is provided. The optoelectronic component may include a first electrode having a first electrically conductive substance, a second electrode having a second electrically conductive substance, and at least one active substance. The active substance is formed within a current path of the first electrode and/or the second electrode, and the active substance is set up to convert the first electrically conductive substance and/or the second electrically conductive substance to an electrically nonconductive substance or region.

12 Claims, 7 Drawing Sheets

(52) U.S. Cl.
CPC ...... *H01L 51/56* (2013.01); *H01L 2251/5369* (2013.01); *H01L 2251/568* (2013.01)

(56) References Cited

U.S. PATENT DOCUMENTS

| | | | |
|---|---|---|---|
| 9,698,367 B2* | 7/2017 | Wang | H01L 51/5206 |
| 2004/0026121 A1* | 2/2004 | Bernds | H01L 21/31133 |
| | | | 174/257 |
| 2004/0077250 A1 | 4/2004 | Miyadera et al. | |
| 2004/0160167 A1 | 8/2004 | Arai et al. | |
| 2004/0164674 A1* | 8/2004 | Ottermann | H01L 27/3239 |
| | | | 313/506 |
| 2008/0237612 A1* | 10/2008 | Cok | B82Y 20/00 |
| | | | 257/88 |
| 2011/0089820 A1 | 4/2011 | Langguth et al. | |
| 2012/0138937 A1 | 6/2012 | Jo et al. | |
| 2012/0175596 A1* | 7/2012 | Faircloth | B82Y 30/00 |
| | | | 257/40 |
| 2013/0284268 A1* | 10/2013 | Yeh | H01L 31/035227 |
| | | | 136/261 |
| 2015/0162468 A1* | 6/2015 | Newman | H01L 31/0322 |
| | | | 136/256 |
| 2015/0270509 A1* | 9/2015 | Ingle | H01L 51/5253 |
| | | | 438/26 |
| 2016/0064696 A1* | 3/2016 | Collier | H01L 21/477 |
| | | | 428/161 |
| 2016/0109625 A1* | 4/2016 | Guimard | H01L 51/0097 |
| | | | 257/40 |
| 2016/0148987 A1* | 5/2016 | Popp | H01L 27/288 |
| | | | 257/40 |
| 2016/0154178 A1* | 6/2016 | Jaeger | H01L 51/5275 |
| | | | 385/14 |
| 2016/0268553 A1* | 9/2016 | Free | H01L 51/5275 |
| 2016/0372700 A1* | 12/2016 | Baisl | H01L 51/448 |
| 2017/0084874 A1* | 3/2017 | Baker | H01L 51/5275 |

FOREIGN PATENT DOCUMENTS

| | | |
|---|---|---|
| EP | 1003229 A1 | 5/2000 |
| EP | 1912268 A1 | 4/2008 |
| WO | 0225750 A1 | 3/2002 |
| WO | 03003411 A2 | 1/2003 |
| WO | 2009133501 A1 | 11/2009 |

OTHER PUBLICATIONS

German Search Report based on Application No. 10 2013 112 253.1(5 Pages) dated Oct. 31, 2014 (Reference Purpose Only).

* cited by examiner

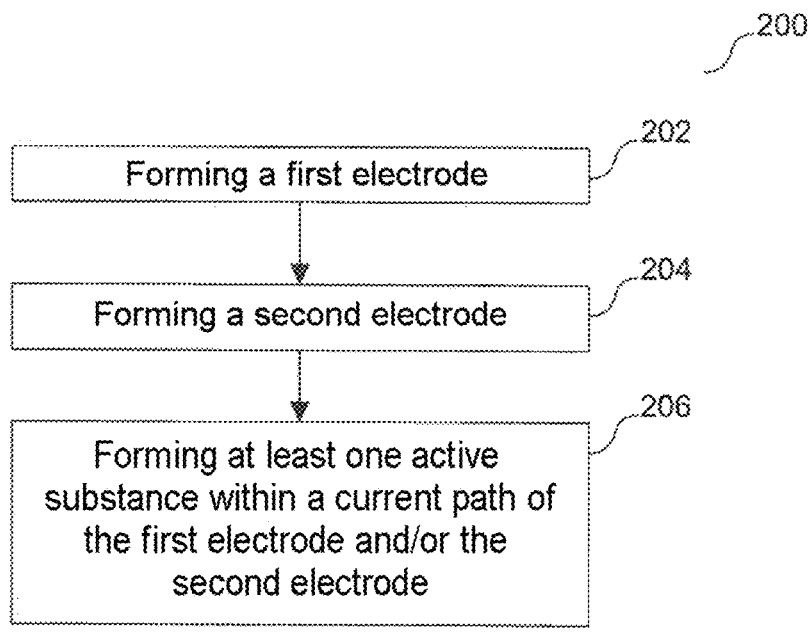

OPTOELECTRONIC COMPONENT, METHOD FOR OPERATING AN OPTOELECTRONIC COMPONENT, AND METHOD FOR PRODUCING AN OPTOELECTRONIC COMPONENT

RELATED APPLICATIONS

The present application is a national stage entry according to 35 U.S.C. §371 of PCT application No.: PCT/EP2014/073832 filed on Nov. 5, 2014, which claims priority from German application No.: 10 2013 112 253.1 filed on Nov. 7, 2013, and is incorporated herein by reference in its entirety.

TECHNICAL FIELD

In various embodiments, an optoelectronic component, a method of operating an optoelectronic component and a method of producing an optoelectronic component are provided.

BACKGROUND

Organic-based optoelectronic components, for example organic light-emitting diodes (OLEDs), are increasingly finding widespread use in general lighting, for example as an areal light source.

An organic optoelectronic component, for example an OLED—illustrated in FIG. 5—may include an anode 510 and a cathode 514 with an organic functional layer in between, on a substrate 502.

The electrodes 512, 514 are separated electrically from one another by means of electrically insulating structures 504. The electrodes 510, 514 can conventionally form electrical contacts in the edge regions of the optoelectronic component by means of contact strips 506 and contact pads 516.

The organic functional layer system 512 may include one or more emitter layer(s) in which electromagnetic radiation is generated, one or more charge carrier pair generation layer structure(s) each composed of two or more charge carrier pair generation layers ("charge generating layers", CGL) for charge carrier pair generation, and one or more electron blocker layer(s), also called hole transport layer(s) (HTL), and one or more hole blocker layer(s), also referred to as electron transport layer(s) (ETL), in order to direct the current flow.

For protection from water and oxygen, the optoelectronic component is conventionally surrounded by a hermetic encapsulation which is impervious to water and oxygen. The encapsulation conventionally includes a thin-film encapsulation 508 and a cover glass 524 laminated on by means of adhesive 522. In addition, a conventional encapsulation may also take the form of a cavity glass encapsulation (cavity encapsulation).

Areal light sources, for example OLEDs, are very prone to defects such as particles 518. The particles 518 may have a measurement in the order of magnitude equal to or greater than the layer thicknesses of the layers of the optoelectronic component. The particles 518 may also lie atop the thin-film encapsulation 508 and be pushed mechanically through the layers of the optoelectronic component. Particles 518 may very frequently lead to a short circuit in the operation of the optoelectronic component, where mechanical stress on the particle by means of stress on the cover glass 524 causes the cathode 514 to form a contact with the anode 510. This can result in spontaneous failure of the lighting means for an indeterminate period of time.

In a conventional method of reducing particle contamination, organic light-emitting diodes are manufactured in cleanrooms with the minimum possible particle contamination, particularly in the case of manufacture of the substrate 502 and the encapsulation 508, 522, 524 of the organic light-emitting diodes. The cleanroom class, for example according to ISO 14644-1, may in principle not be good enough for this purpose, for example a lower particle concentration than in ISO 1 according to ISO 14644-1. Thus, as a result of particle contamination in the production of optoelectronic components, an indeterminate yield loss is to be expected.

In a conventional method of reducing particle contamination, the light-emitting area is discretized and an anti-short circuit means is integrated into the light-emitting area.

In a conventional method of reducing particle contamination, a particle screening method (particle grid method) is used in a cleanroom to detect particle contamination in the production of light-emitting diodes. However, this method is costly and inconvenient and merely reduces the yield loss in manufacturing.

In a conventional method of reducing particle contamination, the components are tested in electrooptical particle screening methods. However, components affected cannot be eliminated 100% from the yield, typically only to an extent of 98-99%.

In a conventional method of reducing particle contamination, the OLEDs are encapsulated with a cavity glass, with application of a layer sequence system composed of hard and soft layers to the organic functional layer stack in the cavity, in order to bind particles. In addition, thick thin-film encapsulations are used, having a thickness of 3 µm to 5 µm. In addition, insulation oils, pastes or adhesives are applied as buffers to the organic functional layer stack.

In addition, it is known that capacitor oils in capacitors lead to self-healing processes at temperatures around 1000 K.

Additionally known are solid-state oxidizing agents for reduction of the short-circuit risk in the event of particle contamination. The possible materials are restricted to particular materials which are nonconductive and nontoxic as reactant/product before/after the process. For efficacy, a certain minimum temperature at the potential short-circuit is required, in order to initiate the reaction.

SUMMARY

In various embodiments, an optoelectronic component, a method of operating an optoelectronic component and a method of producing an optoelectronic component are provided, by which it is possible to reduce spontaneous failures of optoelectronic components, such that the replacement rate of defective lighting means can be reduced.

In various embodiments, an optoelectronic component is provided, having: a first electrode having a first electrically conductive substance, a second electrode having a second electrically conductive substance, and at least one active substance, where the active substance is formed within a current path of the first electrode and/or the second electrode; and where the active substance is set up to convert the first electrically conductive substance and/or the second electrically conductive substance to an electrically nonconductive substance or region.

The electrically nonconductive substance may be a dielectric or electrically insulating substance. However, the electrically nonconductive substance may also be an electrically conductive substance, for example semiconductive substance, where the electrical band structure is altered by means of the chemical conversion such that the band structure has no, few or localized electronic states that could enable conduction of electrical current by the electrically nonconductive substance, the electrically nonconductive substance mixture or the electrically nonconductive region.

In one configuration, the active substance may be a chemically active substance. A chemically active substance may convert an electrically conductive substance chemically to an electrically nonconductive substance, substance mixture or region, for example in that the chemically active substance converts the electrically conductive substance to a dielectric substance, for example by means of an oxidation or a reduction.

In one configuration, the active substance may be a physically active substance. A physically active substance can convert an electrically conductive substance physically to an electrically nonconductive region or an electrically nonconductive substance mixture, for example in that the physically active substance electrically insulates the electrically conductive substance, for example in that the physically active substance interrupts the current path to the electrically conductive substance or becomes bonded to the electrically active substance, in for example surrounds in such a way that it becomes electrically nonconductive.

In one configuration, the active substance may be a chemically active substance and/or a physically active substance.

In one configuration, the first electrically conductive substance may be transparent or translucent.

In one configuration, the first electrically conductive substance may be a transparent electrically conductive oxide.

In one configuration, the first electrode may be transparent or translucent.

In one configuration, the second electrically conductive substance may be transparent or translucent.

In one configuration, the second electrically conductive substance may be a transparent electrically conductive oxide.

In one configuration, the second electrode may be transparent or translucent.

In one configuration, the second electrically conductive substance may include or be formed from a metal.

In one configuration, the second electrically conductive substance may include or be formed from a precious metal.

In one configuration, the second electrically conductive substance may include or be formed from a semiprecious metal.

In one configuration, the active substance may be transparent or translucent with regard to at least one visible light.

In one configuration, the active substance may be dielectric.

In one configuration, the chemically active substance may be electrically conductive and/or electrically nonconductive.

In one configuration, the active substance may be electrically conductive and/or electrically nonconductive after the first electrically conductive substance and/or the second electrically conductive substance have/has been chemically converted.

In one configuration, the chemically active substance may be an oxidizing agent.

In one configuration, the oxidizing agent may have two or more oxidation states.

In one configuration, the chemically active substance may include or be formed from a metal oxide, a metal nitride and/or a metal oxynitride. The metal oxide, the metal nitride and/or the metal oxynitride may have various oxidation states or reduction states. At various temperatures, the metal oxide, the metal nitride and/or the metal oxynitride can release oxygen or nitrogen and thus act as oxidizing agent or reducing agent. The oxygen or nitrogen released can react chemically with an electrically conductive substance in the optoelectronic component and convert it to an electrically nonconductive, electrically insulating or electrically nonconductive substance or region. In one configuration, the metal oxide, the metal nitride and/or the metal oxynitride, after the chemical activation, can react directly with the electrically conductive substance and convert it chemically. In one configuration, the metal oxide, the metal nitride and/or the metal oxynitride, after the release of oxygen or nitrogen, can react directly with the electrically conductive substance and convert it chemically.

In one configuration, the chemically active substance may include or be formed from one of the following substances or substance components: manganese, osmium, copper, vanadium, sodium, titanium, potassium, permanganate, dichromate, percarbonate, oxide, nitride, oxynitride; for example manganese oxide, titanium oxide, vanadium oxide, copper oxide, osmium oxide; amine oxides, for example N-methylmorpholine N-oxide. The chemically active substance can react chemically with various substances in an electrically conductive layer, for example at different temperatures, for example in the case of an electrode or an electrically conductive layer of the organic functional layer structure having several electrically conductive substances.

In one configuration, the chemically active substance may be a reducing agent. For example, the active substance as reducing agent can convert the material of the anode, for example in the case of an optoelectronic component set up as a top emitter.

In one configuration, the reducing agent may have two or more reduction states.

In one configuration, the physically active substance may be fusible, for example may be or include a thermoplastic.

In one configuration, the physically active substance may be agglomeratable, for example thermally agglomeratable.

In one configuration, the physically active substance may include or be formed from one of the following substances: an alkyl thiol, for example dithioerythritol (melting point: 40° C. to 80° C.), hexadecanethiol (melting point 20° C.); a linear low-density polyethylene (LLD-PE) (melting temperature 40° C. to 120° C., can melt from 30° C. in the event of temperature increases); block copolymers, a thermoplastic—can melt on exceedance of a particular temperature, for example polypropylene from 160° C.; a thermoset—can break down on exceedance of a certain temperature.

In one configuration, the optoelectronic component may further include nanoparticles, in which case the nanoparticles include or are formed from the active substance.

In one configuration, the nanoparticles may have a core and a shell, the core being surrounded by the shell, and the core including or being formed from the chemically active substance.

In one configuration, the shell may be set up to shield the chemically active substance from a chemical reaction.

In one configuration, the active substance may include a physically active substance and a chemically active substance.

In one configuration, the nanoparticles may be set up such that the shell includes or is formed from a physically active substance and the core includes or is formed from a chemically active substance.

In one configuration, the nanoparticles may be set up such that the shell can be thermally detached from the core, in such a way that the core can be thermally exposed.

In one configuration, the physically active substance may be set up so as to be activatable, in such a way that the first electrically conductive substance and/or the second electrically conductive substance after activation of the physically active substance are/is converted at least partly to a nonconductive region, for example are/is electrically insulated, for example locally in a region around the physically active substance.

In one configuration, the chemically active substance may be set up so as to be activatable, in such a way that the first electrically conductive substance and/or the second electrically conductive substance after activation of the chemically active substance can be converted chemically to an electrically nonconductive substance or region.

In one configuration, the active substance may be set up such that the conversion is thermally activatable.

In one configuration, the thermal activation can be effected by means of heating, for example by means of an electrical short circuit.

In one configuration, the active substance may be chemically activatable within a temperature range from about 20° C. to about 1500° C.

In one configuration, the active substance may be set up such that the conversion is activatable by means of electromagnetic radiation.

In one configuration, the active substance may be set up such that the conversion is activatable by means of a magnetic field.

In one configuration, the active substance may be set up such that the conversion is activatable by means of an electrical field.

In one configuration, the active substance may be set up such that the conversion is activatable by means of an alteration of the pH in the environment of the active substance.

In one configuration, the active substance may be set up such that the conversion is activatable by means of an electrical current.

In one configuration, the active substance, with respect to the first electrode and/or the second electrode, may be arranged such that the first electrode and/or the second electrode chemically activate the chemically active substance, for example by means of physical contact of the first electrically conductive substance and/or the second electrically conductive substance with the active substance.

In one configuration, the active substance, with respect to the first electrode and/or the second electrode, may be arranged such that the active substance is a self-passivating with respect to the first electrode and/or the second electrode. In other words: the first electrode and/or the second electrode activate the active substance, as a result of which the active substance converts the first electrically conductive substance and/or the second electrically conductive substance locally to a nonconductive substance. As a result, the current flow between the first electrode and the second electrode can be interrupted, reduced and/or deflected at least locally.

In one configuration, the active substance can be distributed in the first electrode in such a way that the first electrode includes the active substance.

In one configuration, the active substance can be distributed in the second electrode in such a way that the second electrode includes the active substance.

In one configuration, the optoelectronic component may further have a layer structure, the layer structure being formed between the first electrode and the second electrode and including the active substance.

In one configuration, the active substance may be distributed in the layer structure in such a way that the layer structure includes the active substance.

In one configuration, the layer structure may include a layer, the layer including or being formed from the active substance.

In one configuration, the layer structure may be an organic functional layer structure.

In one configuration, the organic functional layer structure may include an optically active layer, the optically active layer being configured for emission and/or absorption of electromagnetic radiation.

In one configuration, the active substance may be formed atop or above the first electrode and/or the second electrode.

In one configuration, the active substance may be arranged in two or more layers atop or above the first electrode and/or second electrode.

In one configuration, the active substance may be formed as an interlayer in the first electrode and/or in the second electrode.

In one configuration, the electrically nonconductive substance may be transparent or translucent with respect to visible light.

In one configuration, the chemically active substance may be formed and arranged in the current path such that the electrically nonconductive substance interrupts, deflects and/or reduces at least one current path between the first electrode and the second electrode.

In one configuration, the optoelectronic component may take the form of an areal component.

In one configuration, the optoelectronic component may take the form of an organic optoelectronic component.

In one configuration, the optoelectronic component may take the form of a light-emitting diode, a photodetector and/or a solar cell.

In various embodiments, a method of operating an optoelectronic component is provided, wherein the optoelectronic component has one of the configurations detailed above; the method including activating the active substance in such a way that the at least one active substance converts an electrically conductive substance in a current path of the first electrode and/or the second electrode to an electrically nonconductive substance or region.

In one configuration of the method, the activation may include application of an overvoltage to the optoelectronic component. This can result in conditioning of the optoelectronic component, in that particle-contaminated sites in the optoelectronic component in the proximity of active substance are converted, for example chemically converted, to electrically nonconductive regions. An overvoltage is a voltage higher than the operating voltage of the optoelectronic component, for example in the form of a brief voltage pulse having a high pulse height, for example a voltage pulse having a pulsewidth within a range from about 10 µs to about 100 ms and a pulse height within a range from about 200 V to about 10 kV.

In one configuration of the method, the activation may include irradiation of the active substance, for example with electromagnetic radiation, an electrical field and/or a magnetic field.

In one configuration of the method, the irradiation of the active substance can be effected in structured form, for example in order to present information by means of the converted electrically nonconductive region, for example after the encapsulation structure on the electrically active region has been formed. This allows the converted region of the optoelectronic component in the optically active and/or optically inactive state to have a different appearance than the unstructured region, for example a color and/or brightness contrast. This allows, for example, a written message, a symbol, an ideogram and/or a pictogram to be shown in the light-emitting area of an optoelectronic component.

In various embodiments, a method of producing an optoelectronic component is provided, the method including: forming a first electrode having a first electrically conductive substance, forming a second electrode having a second electrically conductive substance, the second electrode being formed above the first electrode; and forming at least one active substance, where the active substance is formed within a current path of the first electrode and/or the second electrode; and where the active substance is set up to convert the first electrically conductive substance and/or the second electrically conductive substance to an electrically nonconductive substance or region.

In one configuration of the method, the active substance may be a chemically active substance.

In one configuration of the method, the active substance may be a physically active substance.

In one configuration of the method, the first electrically conductive substance may be transparent or translucent.

In one configuration of the method, the first electrically conductive substance may be a transparent electrically conductive oxide.

In one configuration of the method, the first electrode may be transparent or translucent.

In one configuration of the method, the second electrically conductive substance may be transparent or translucent.

In one configuration of the method, the second electrically conductive substance may be a transparent electrically conductive oxide.

In one configuration of the method, the second electrode may be transparent or translucent.

In one configuration of the method, the second electrically conductive substance may include or be formed from a metal.

In one configuration of the method, the second electrically conductive substance may include or be formed from a precious metal.

In one configuration of the method, the second electrically conductive substance may include or be formed from a semiprecious metal.

In one configuration of the method, the active substance may be transparent or translucent with respect to at least one visible light.

In one configuration of the method, the active substance may be dielectric.

In one configuration of the method, the active substance may be dielectric or electrically nonconductive.

In one configuration of the method, the active substance may be dielectric or electrically nonconductive after the first electrically conductive substance and/or the second electrically conductive substance have/has been chemically converted.

In one configuration of the method, the chemically active substance may be an oxidizing agent.

In one configuration of the method, the oxidizing agent may have two or more oxidation states.

In one configuration of the method, the chemically active substance may include or be formed from a manganese.

In one configuration of the method, the chemically active substance may include or be formed from one of the following substances or substance components: manganese, osmium, copper, vanadium, sodium, titanium, potassium, permanganate, dichromate, percarbonate, oxide, nitride, oxynitride; for example manganese oxide, titanium oxide, vanadium oxide, copper oxide, osmium oxide; amine oxides, for example N-methylmorpholine N-oxide.
include or be formed from a manganese oxide.

In one configuration of the method, the chemically active substance may be a reducing agent.

In one configuration of the method, the reducing agent may have two or more reduction states.

In one configuration of the method, the physically active substance may be fusible, for example be or include a thermoplastic.

In one configuration of the method, the physically active substance may be agglomeratable, for example thermally agglomeratable.

In one configuration of the method, the physically active substance may include or be formed from one of the following substances: an alkyl thiol, for example dithioerythritol (melting point: 40° C. to 80° C.), hexadecanethiol (melting point 20° C.); a linear low-density polyethylene (LLD-PE) (melting temperature 40° C. to 120° C., can melt from 30° C. in the event of temperature increases); block copolymers, a thermoplastic—can melt on exceedance of a particular temperature, for example polypropylene from 160° C.; a thermoset—can break down on exceedance of a certain temperature.

In one configuration of the method, the method may further include arranging of nanoparticles, said nanoparticles including or being formed from the active substance.

In one configuration of the method, the nanoparticles may have a core and a shell, the core being surrounded by the shell, and the core including or being formed from the chemically active substance.

In one configuration of the method, the shell may be set up to shield the chemically active substance from a chemical reaction.

In one configuration of the method, the active substance may include a physically active substance and a chemically active substance.

In one configuration of the method, the nanoparticles may be set up such that the shell includes or is formed from a physically active substance and the core includes or is formed from the chemically active substance.

In one configuration of the method, the nanoparticles may be set up such that the shell is thermally detachable from the core, in such a way that the core can be thermally exposed.

In one configuration of the method, the physically active substance may be set up so as to be activatable, in such a way that the first electrically conductive substance and/or the second electrically conductive substance after activation of the physically active substance are/is converted at least partly to a nonconductive region, for example are/is electrically insulated, for example locally in a region around the physically active substance.

In one configuration of the method, the chemically active substance may be set up so as to be activatable, in such a way that the first electrically conductive substance and/or the second electrically conductive substance after activation of the chemically active substance are/is converted chemically to an electrically nonconductive substance or region.

In one configuration of the method, the active substance may be set up such that the conversion is thermally activatable.

In one configuration of the method, the thermal activation can be effected by means of heating.

In one configuration of the method, the active substance may be chemically activatable within a temperature range from about 20° C. to about 1500° C.

In one configuration of the method, the active substance may be set up such that the conversion is activatable by means of electromagnetic radiation.

In one configuration of the method, the active substance may be set up such that the conversion is activatable by means of a magnetic field.

In one configuration of the method, the active substance may be set up such that the conversion is activatable by means of an electrical field.

In one configuration of the method, the active substance may be set up such that the conversion is activatable by means of an electrical current.

In one configuration of the method, the active substance may be set up such that the conversion is activatable by means of an alteration of the pH in the environment of the active substance.

In one configuration of the method, the active substance, with respect to the first electrode and/or the second electrode, may be arranged such that the first electrode and/or the second electrode chemically activate the chemically active substance.

In one configuration of the method, the active substance, with respect to the first electrode and/or the second electrode, may be arranged such that the active substance is a self-passivating with respect to the first electrode and/or the second electrode.

In one configuration of the method, the active substance can be distributed in the first electrode in such a way that the first electrode includes the active substance.

In one configuration of the method, the active substance can be distributed in the second electrode in such a way that the second electrode includes the active substance.

In one configuration of the method, the method may further include forming of a layer structure, the layer structure being formed between the first electrode and the second electrode and including the active substance.

In one configuration of the method, the active substance may be distributed in the layer structure in such a way that the layer structure includes the active substance.

In one configuration of the method, the forming of the layer structure may include forming of a layer, the layer including or being formed from the active substance.

In one configuration of the method, the layer structure may be an organic functional layer structure.

In one configuration of the method, the organic functional layer structure may include an optically active layer, the optically active layer being configured for emission and/or absorption of electromagnetic radiation.

In one configuration of the method, the active substance may be formed atop or above the first electrode and/or the second electrode.

In one configuration of the method, the active substance may be arranged or formed in two or more layers atop or above the first electrode and/or second electrode.

In one configuration of the method, the active substance may be formed as an interlayer in the first electrode and/or in the second electrode.

In one configuration of the method, the electrically nonconductive substance may be transparent or translucent with respect to visible light.

In one configuration of the method, the active substance may be formed and arranged in the current path such that the electrically nonconductive substance interrupts, deflects and/or reduces at least one current path between the first electrode and the second electrode.

In one configuration of the method, the optoelectronic component may take the form of an areal component.

In one configuration of the method, the optoelectronic component may take the form of an organic optoelectronic component.

In one configuration of the method, the optoelectronic component may take the form of a light-emitting diode, a photodetector and/or a solar cell.

BRIEF DESCRIPTION OF THE DRAWINGS

The invention is explained in greater detail below on the basis of an exemplary embodiment, wherein also as before no distinction will be drawn specifically among the claim categories and the features in the context of the independent claims are intended also to be disclosed in other combinations. In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 2 shows a schematic diagram of a method of producing an optoelectronic component according to various working examples;

DETAILED DESCRIPTION

Figure 1A:
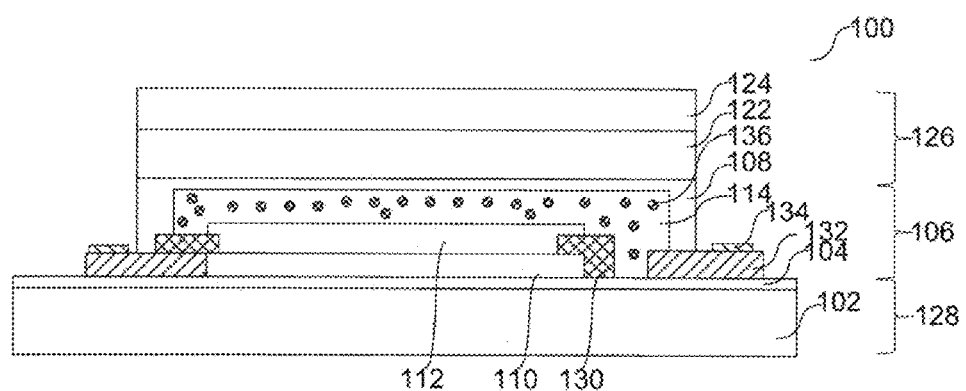
FIGS. 1A, and 1B show schematic diagrams of optoelectronic components in various working examples.

In the detailed description which follows, reference is made to the appended drawings, which form part of this description and in which specific embodiments in which the invention can be executed are shown for illustration. In this regard, directional terminology, for instance "top", "bottom", "front", "back", "foremost", "rearmost", etc. is used with reference to the orientation of the figure(s) described. Since components of embodiments can be positioned in a multitude of different orientations, the directional terminology serves for illustration and is not restrictive in any way whatsoever. It will be apparent that other embodiments can be utilized and structural or logical changes can be made without deviating from the scope of protection of the present invention. It will be apparent that the features of the various illustrative embodiments described herein can be combined with one another unless specifically stated otherwise. The detailed description which follows should therefore not be interpreted in a restrictive manner, and the scope of protection of the present invention is defined by the appended claims.

In the context of this description, the terms "connected", "attached" and "coupled" are used to describe either a direct or an indirect connection, a direct or indirect attachment, and a direct or indirect coupling. In the figures, identical or similar elements are given identical reference symbols, if appropriate.

In various embodiments, optoelectronic components are described, wherein an optoelectronic component has an optically active region. The optically active region of an optoelectronic component may absorb electromagnetic radiation and form, i.e. convert, a photocurrent therefrom; or, by means of a voltage applied to the optically active region, emit electromagnetic radiation. In various embodiments, the electromagnetic radiation may have a wavelength range including x-radiation, UV radiation (A-C), visible light and/or infrared radiation (A-C).

Providing electromagnetic radiation may be understood to mean emitting of electromagnetic radiation. In other words: providing of electromagnetic radiation can be understood to mean emitting of electromagnetic radiation by means of a voltage applied to an optically active region.

Acceptance of electromagnetic radiation may be understood to mean absorption of electromagnetic radiation. In other words: acceptance of electromagnetic radiation can be understood to mean absorption of electromagnetic radiation and formation of a photocurrent from the electromagnetic radiation absorbed. In other words: absorption of electromagnetic voltage can be understood to mean a conversion of electromagnetic radiation to an electrical current and/or an electrical voltage.

An electromagnetic radiation-emitting structure may, in various configurations, be an electromagnetic radiation-emitting semiconductor structure and/or take the form of an electromagnetic radiation-emitting diode, of an organic electromagnetic radiation-emitting diode, of an electromagnetic radiation-emitting transistor or of an organic electromagnetic radiation-emitting transistor. The radiation may, for example, be light (in the visible region), UV radiation and/or infrared radiation. In this connection, the electromagnetic radiation-emitting component may take the form, for example, of a light-emitting diode (LED), of an organic light-emitting diode (OLED) of a light-emitting transistor or of an organic light-emitting transistor. The electromagnetic radiation-emitting component may, in various configurations, be part of an integrated circuit. In addition, a multitude of electromagnetic radiation-emitting components may be provided, accommodated, for example, in a common housing.

In various working examples, an optoelectronic structure may take the form of an organic light-emitting diode (OLED), an organic field-effect transistor (OFET) and/or an organic electronic device. The organic field-effect transistor may be what is called an "all-OFET", in which all the layers are organic. An optoelectronic structure may include an organic functional layer system, which is also referred to synonymously as organic functional layer structure. The organic functional layer structure may include or be formed from an organic substance or an organic substance mixture set up, for example, for provision of electromagnetic radiation from an electrical current provided.

An optoelectronic component having an optically active region may have one or more optically active faces. A flat component having two flat, optically active faces may, for example, be transparent or translucent in the direction of bonding of the optically active faces. A flat component may also be referred to as a planar component. However, the optically active region may also have a flat, optically active face and a flat, optically inactive face, for example an organic light-emitting diode set up as a top emitter or bottom emitter. The optically inactive face may, for example, be provided with a mirror structure, for example a mirror structure having electrically switchable reflectivity and/or an opaque substance or substance mixture, for example for distribution of heat; which enables direction of the beam path of the component.

In various working examples, the optoelectronic component may be set up as an organic light-emitting diode, an organic photodetector or an organic solar cell.

An organic light-emitting diode may be set up as a top emitter or a bottom emitter. In a bottom emitter, light is emitted from the electrically active region through the carrier. In a top emitter, light is emitted from the top face of the electrically active region and not through the carrier.

A top emitter and/or bottom emitter may also be optically transparent or optically translucent; for example, each of the layers or structures described below may be transparent or translucent.

In the context of this description, a chemically active substance can chemically oxidize or chemically reduce another substance and/or itself be chemically oxidized or chemically reduced. A chemically active substance may, for example, be a substance that an electrode chemically oxidizes or reduces.

In the context of this description, a chemical conversion may be understood to mean the forming of a second substance or second substance mixture from a first substance or first substance mixture. The chemical conversion can be effected as an oxidation or a reduction of the first substance or first substance mixture.

In the context of this description, a physical conversion may be understood to mean the forming of an electrically insulating substance or an electrically insulating substance mixture, as a result of which an existing electrical connection is interrupted, deflected or reduced. The physical conversion can be effected as a formation of an electrical insulation in the current path of an electrical current, for example by means of agglomeration of a distributed and electrically permeable electrically insulating substance.

The optoelectronic component 100 (illustrated in FIG. 1A and FIG. 1B) may take the form, for example, of a flat component. The electronic component 100 may take the form, for example, of an organic optoelectronic component. The optoelectronic component 100 may take the form, for example, of a light-emitting diode, a photodetector and/or a solar cell.

The electronic component 100 may include a first electrode 110 including a first electrically conductive substance, a second electrode 114 including a second electrically conductive substance, and at least one active substance 136.

The active substance 136 may be formed within a current path of the first electrode 110 and/or the second electrode 114. The active substance 136 may be set up to convert the first electrically conductive substance and/or the second electrically conductive substance to an electrically nonconductive substance or region 140 (indicated in FIG. 1B by means of the dotted line around a particle-contaminated site 138 shown in schematic form).

The active substance 136 may take the form of, for example be arranged as, a solid on and/or in the layers of the optoelectronic component 100.

The active substance 136 can be activated in such a way that it can convert the first electrically conductive substance and/or the second electrically conductive substance to an electrically nonconductive substance or region.

The activation of the active substance 136 can be effected, for example, by means of supply of energy, for example heating of the active substance 136. A heat source for the heating of the active substance 136 may, for example, be a laser and/or a particle-contaminated site 138 in the optoelectronic component 100.

In the case of a particle-contaminated site 138, the first electrode 110 may have a smaller distance from the second electrode 114 than in the rest of the region of the first electrode 110 and the second electrode 114. As a result, a greater electrical current can flow in the region of the particle-contaminated site 138. The higher electrical current can lead to heating of the particle-contaminated site 138. The heat generated as a result can lead to activation of the active substance 136 in the proximity of the particle-contaminated site 138, meaning that the (potentially) active substance becomes active. The active substance 136 after the activation can convert the electrically conductive substance in the environment of the activated substance to an electrically nonconductive substance or region. For example, the active substance 136 can utilize the evolution of heat in the particle-contaminated site 138 to act as an oxidizing agent in the region of the particle-contaminated site 138 and to oxidize the particle-contaminated site 138, which can then become nonconductive.

The active substance 138, for example in the form of an oxidizing agent, a reducing agent and/or an electrical insulation agent, should have the following properties: there should be no reaction with the layers of the optoelectronic component 100 before the active substance 136 is activated, for example no reaction with the hermetic substrate 128, the first electrode 110, the organic functional layer structure 112, the second electrode 114, the second thin barrier layer 108, the cover glass 124 and/or the adhesive 122; for example not until occurrence of a short circuit.

In the event of increasing the temperature of the active substance 136, for example on exceedance of a critical temperature, the active substance 136 should react chemically with at least one substance in a layer of the optoelectronic component 100, for example with elimination of an oxidizing component which can oxidize the organic functional layer structure 112, the first electrode 110 and/or the second electrode 114 at the site 138 in question in each case. The site in question should become a nonconductor, for example become dielectric. Unreacted residual constituents of the active substance 136 should ideally likewise be nonconductors, for example be dielectric. For example, all chemical products after the conversion of the first electrically conductive substance and/or the second electrically conductive substance should be nonconductive, i.e. interrupt, reduce and/or deflect the current flow; for example, the active substance 136 is also electrically nonconductive.

The active substance 136 should have a very high contact area with the substance to be converted. For example, a chemically active substance 136 can be applied in the form of nanoparticles, for example core-shell nanoparticles, in and/or on at least some of the layers of the optoelectronic component 100.

The active substance 136, on activation of a particle-contaminated site 138, for example on formation of a short circuit, should be able to exploit the generation of heat and/or increase in temperature (evolution of heat) and the very high reactive surface area, in the region of the particle-contaminated site 138, for example by means of melting-away of the shell of the core-shell nanoparticles, to chemically activate the chemically active substance even at relatively low temperature, for example within a temperature range from about 100° C. to about 150° C., i.e. in this example to release it. The temperature at which the chemically active substance is activated should be greater than the maximum temperature that occurs on a regular basis in the operation or storage of the optoelectronic component. The layer in question, or the particle-contaminated site 138, can be chemically converted, for example chemically reduced or oxidized; and/or electrically insulated. The chemically converted region should be electrically nonconductive, for example dielectric.

Alternatively, in the region of the damage, simple nanoparticles can act as the chemically active substance 136 at higher temperatures, for example more than 200° C., by means of a chemical reaction and electrically insulate the contaminated site 138.

Alternatively, the active substance 136 can conglomerate or aggregate in the form of electrically nonconductive nanoparticles after the activation to give electrically insulating larger regions, for example by means of coalescence of the active substance 136, and hence electrically insulate an electrical short circuit.

Working examples of the active substance are described further down.

In addition, the optoelectronic component 100 may have a hermetic substrate 128, an active region 106 and an encapsulation structure 126.

The hermetic substrate 126 may have a carrier 102 and a first barrier layer 104.

The active region 106 is an electrically active region 106 and/or an optically active region 106. The active region 106 is, for example, the region of the optoelectronic component 100 in which electrical current flows for operation of the optoelectronic component 100 and/or in which electromagnetic radiation is generated and/or absorbed.

The electrically active region 106 may include the first electrode 110, an organic functional layer structure 112 and the second electrode 114 and the chemically active substance 136.

The organic functional layer structure 112 may have one, two or more functional layer structure unit(s) and one, two or more interlayer structure(s) between the layer structure units. The organic functional layer structure 112 may have, for example, a first organic functional layer structure unit 116, an interlayer structure 118 and a second organic functional layer structure unit 120.

The encapsulation structure 128 may have a second barrier layer 108, a cohesive bonding layer 122 and a cover 124.

The carrier 102 may include or be formed from glass, quartz sand and/or a semiconductor material. In addition, the carrier may include or be formed from a polymer film or a laminate having one or more polymer films. The polymer may include or be formed from one or more polyolefins (for example high- or low-density polyethylene (PE), or polypropylene (PP)). In addition, the polymer may include or be formed from polyvinyl chloride (PVC), polystyrene (PS), polyester and/or polycarbonate (PC), polyethylene terephthalate (PET), polyether sulfone (PES) and/or polyethylene naphthalate (PEN).

The carrier 102 may include or be formed from a metal, for example copper, silver, gold, platinum, iron, for example a metal composite, for example steel.

The carrier 102 may have an opaque, translucent or even transparent configuration.

The carrier 102 may be part of or may form a mirror structure.

The carrier 102 may have a mechanically rigid region and/or a mechanically flexible region or be formed in such a way, for example as a film.

The carrier 102 may be set up as a waveguide for electromagnetic radiation, for example may be transparent or translucent with regard to the electromagnetic radiation emitted or absorbed by the optoelectronic component 100.

The first barrier layer 104 may include or be formed from one of the following materials: aluminum oxide, zinc oxide, zirconium oxide, titanium oxide, hafnium oxide, tantalum oxide, lanthanum oxide, silicon oxide, silicon carbide, silicon nitride, silicon oxynitride, indium tin oxide, indium zinc oxide, aluminum-doped zinc oxide, poly(p-phenylene-terephthalamide), nylon-6,6, and mixtures and alloys thereof.

The first barrier layer 104 may be formed by means of one of the following methods: an atomic layer deposition (ALD) method, for example a plasma-enhanced atomic layer deposition (PEALD) method or a plasma-less atomic layer deposition (PLALD) method; a chemical vapor deposition (CVD) method, for example a plasma-enhanced chemical vapor deposition (PECVD) method or a plasma-less chemical vapor deposition (PLCVD) method; or alternatively by means of other suitable deposition methods.

In the case of a first barrier layer 104 having a plurality of component layers, some or all component layers can be formed by means of an atomic layer deposition method. A layer sequence including only ALD layers can also be referred to as a "nanolaminate".

In the case of a first barrier layer 104 having a plurality of component layers, one or more component layers of the first barrier layer 104 can be deposited by means of a different deposition method than an atomic layer deposition method, for example by means of a vapor deposition method.

The first barrier layer 104 may have a layer thickness of about 0.1 nm (one atom layer) to about 1000 nm, for example a layer thickness of about 10 nm to about 100 nm in one configuration, for example about 40 nm in one configuration.

The first barrier layer 104 may include one or more materials of high refractive index, for example one or more material(s) having a high refractive index, for example having a refractive index of at least 2.

In addition, it should be pointed out that it is also possible to entirely dispense with a first barrier layer 104 in various working examples, for example if the carrier 102 is hermetic, for example includes or is formed from glass, metal, metal oxide.

The first electrode 104 may take the form of the anode or of the cathode.

The first electrode 110 may include or be formed from one of the following electrically conductive materials: a metal; a transparent conductive oxide (TCO), a network composed of metallic nanowires and nanoparticles, for example of Ag, combined, for example, with conductive polymers; a network composed of carbon nanotubes combined, for example, with conductive polymers; graphene particles and layers; a network composed of semiconductive nanowires; an electrically conductive polymer; a transition metal oxide; and/or composites thereof. The first electrode 110 composed of a metal or including a metal may include or be formed from one of the following materials: Ag, Pt, Au, Mg, Al, Ba, In, Ca, Sm or Li, and compounds, combinations or alloys of these materials. The first electrode 110 may include one of the following materials as transparent conductive oxide: for example metal oxides: for example zinc oxide, tin oxide, cadmium oxide, titanium oxide, indium oxide or indium tin oxide (ITO). As well as binary metal-oxygen compounds, for example $ZnO$, $SnO_2$ or $In_2O_3$, the group of the TCOs also includes ternary metal-oxygen compounds, for example $AlZnO$, $ZnSnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides, and these can be used in various working examples. In addition, the TCOs do not necessarily correspond to a stoichiometric composition and may also be p-doped or n-doped, or be hole-conducting (p-TCO) or electron-conducting (n-TCO).

The first electrode 110 may have one layer or a layer stack of several layers of the same material or different materials. The first electrode 110 may be formed by a layer stack of a combination of a layer of a metal on a layer of a TCO, or vice versa. One example is a silver layer applied to an indium tin oxide layer (ITO) (Ag on ITO) or ITO—Ag—ITO multilayers.

The first electrode 104 may have, for example, a layer thickness within a range from 10 nm to 500 nm, for example from less than 25 nm to 250 nm, for example from 50 nm to 100 nm.

The first electrode 110 may have a first electrical connection to which a first electrical potential can be applied. The first electrical potential can be supplied by an energy source, for example a power source or a voltage source. Alternatively, the first electrical potential may be applied to an electrically conductive carrier 102 and the first electrode 110 can be electrically supplied indirectly by the carrier 102. The first electrical potential may, for example, be the ground potential or another predefined reference potential.

The first electrically conductive substance may be transparent or translucent. The first electrically conductive substance may, for example, be a transparent electrically conductive oxide. The first electrode may be transparent or translucent.

Figure 1B:
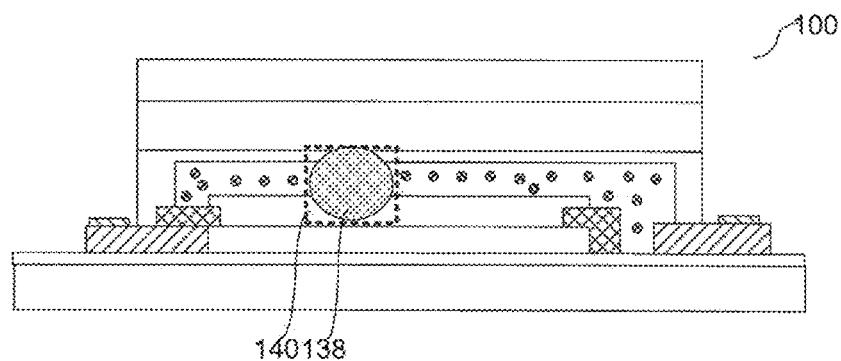

FIGS. 1A and 1B show an optoelectronic component 100 having a first organic functional layer structure unit 116 and a second organic functional layer structure unit 120. In various working examples, the organic functional layer structure 112 may alternatively have more than two organic functional layer structures, for example 3, 4, 5, 6, 7, 8, 9, 10, or even more, for example 15 or more, for example 70.

The first organic functional layer structure unit 116 and the optional further organic functional layer structures may be the same or different, for example have an identical or different emitter material. The second organic functional layer structure unit 120, or the further organic functional layer structure units, may be set up like one of the configurations of the first organic functional layer structure unit 116 described hereinafter.

The first organic functional layer structure unit 116 may have a hole injection layer, a hole transport layer, an emitter layer, an electron transport layer and an electron injection layer.

In an organic functional layer structure unit 112, one or more of the layers mentioned may be provided, in which case identical layers may have physical contact, may merely be electrically connected to one another or may even be electrically insulated from one another, for example may be formed alongside one another. Individual layers among the layers mentioned may be optional.

A hole injection layer may be formed atop or above the first electrode 110. The hole injection layer may include or be formed from one or more of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB (N,N'-bis(naphthalen-2-yl)-N,N'-bis(phenyl)-benzidine); TPD (N,N'-bis(3-methylphenyl)-N,N'-bis-(phenyl)benzidine); spiro-TPD (N,N'-bis(3-methyl-phenyl)-N,N'-bis(phenyl)benzidine); spiro-NPB (N,N'-bis(naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(N,N-diphenylamino)-9,9'-spirobifluorene); 9,9-bis[4-(N,N-bis(biphenyl-4-yl)amino)-phenyl]-9H-fluorene; 9, 9-bis[4-(N,N-bis(naphthalen-2-yl)amino)phenyl]-9H-fluorene; 9,9-bis[4-(N,N'-bis(naphthalen-2-yl)-N,N'-bisphenylamino)phenyl]-9H-fluorine; N,N'-bis(phenanthren-9-yl)-N,N'-bis(phenyl)-benzidine; 2,7-bis[N,N-bis(9,9-spirobifluoren-2-yl)-amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di[4-(N,N-ditolylamino)-phenyl]cyclohexane; 2,2',7,7'-tetra(N,N-ditolyl)aminospirobifluorene; and/or N,N,N',N'-tetra(naphthalen-2-yl)benzidine.

The hole injection layer may have a layer thickness within a range from about 10 nm to about 1000 nm, for example within a range from about 30 nm to about 300 nm, for example within a range from about 50 nm to about 200 nm.

A hole transport layer may be formed atop or above the hole injection layer. The hole transport layer may include or be formed from one or more of the following materials: NPB (N,N'-bis(naphthalen-1-yl)-N,N'-bis(phenyl)benzidine); beta-NPB (N,N'-bis(naphthalen-2-yl)-N,N'-bis(phenyl)benzidine); TPD (N,N'-bis(3-methylphenyl)-N,N'-bis(phenyl)benzidine); spiro-TPD (N,N'-bis(3-methylphenyl)-N,N'-bis(phenyl)benzidine); spiro-NPB (N,N'-bis(naphthalen-1-yl)-N,N'-bis(phenyl)-Spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(N,N-diphenylamino)-9,9'-spirobifluorene); 9, 9-bis[4-(N,N-bis-(biphenyl-4-yl)amino)phenyl]-9H-fluorene; 9,9-bis[4-(N,N-bis(naphthalen-2-yl)amino)phenyl]-9H-fluorene; 9,9-bis[4-(N,N'-bis(naphthalen-2-yl)-N,N'-bisphenyl-amino)phenyl]-9H-fluorine; N,N'-bis(phenanthren-9-yl)-N,N'-bis(phenyl)benzidine; 2,7-bis[N,N-bis(9,9-spirobifluoren-2-yl)amino]-9,9-spirobifluorene; 2,2'-bis-[N,N-bis(biphenyl-4-yl)amino]-9,9-spirobifluorene; 2,2'-bis(N,N-diphenylamino)-9,9-spirobifluorene; di[4-(N,N-ditolylamino)phenyl]cyclohexane; 2,2',7,7'-tetra(N,N-ditolyl)aminospirobifluorene; and N,N,N',N'-tetra(naphthalen-2-yl)benzidine, a tertiary amine, a carbazole derivative, a conductive polyaniline and/or polyethylenedioxythiophene.

The hole transport layer may have a layer thickness within a range from about 5 nm to about 50 nm, for example within a range from about 10 nm to about 30 nm, for example about 20 nm.

An emitter layer may be formed atop or above the hole transport layer. Each of the organic functional layer structure units 116, 120 may have one or more emitter layers, for example having fluorescent and/or phosphorescent emitters.

An emitter layer may include or be formed from organic polymers, organic oligomers, organic monomers, organic small nonpolymeric molecules ("small molecules") or a combination of these materials.

The optoelectronic component 100 may include or be formed from, in an emitter layer, one or more of the following materials: organic or organometallic compounds such as derivatives of polyfluorene, polythiophene and polyphenylene (e.g. 2- or 2,5-substituted poly-p-phenylenevinylene) and metal complexes, for example iridium complexes such as blue-phosphorescing FIrPic (bis(3,5-difluoro-2-(2-pyridyl)phenyl-(2-carboxypyridyl)iridium (III)), green-phosphorescing Ir(ppy)3 (tris(2-phenylpyridine)-iridium(III)), red-phosphorescing Ru(dtb-bpy)$_3$*2(PF$_6$) (tris[4,4'-di-tert-butyl-(2,2')-bipyridine]-ruthenium(III) complex) and blue-fluorescing DPAVBi (4,4-bis[4-(di-p-tolylamino)styryl]biphenyl), green-fluorescing TTPA (9,10-bis[N,N-di(p-tolyl)amino]-anthracene) and red-fluorescing DCM2 ((4-dicyanomethylene)-2-methyl-6-julolidyl-9-enyl-4H-pyran) as nonpolymeric emitters.

Such nonpolymeric emitters can be deposited, for example, by means of thermal evaporation. In addition, it is possible to use polymer emitters which can be deposited, for example, by means of a wet-chemical method, for example a spin-coating method.

The emitter materials may suitably be embedded in a matrix material, for example an industrial ceramic or a polymer, for example an epoxide; or a silicone.

In various working examples, the emitter layer may have a layer thickness within a range from about 5 nm to about 50 nm, for example within a range from about 10 nm to about 30 nm, for example about 20 nm.

The emitter layer may include emitter materials that emit in one color or various colors (for example blue and yellow or blue, green and red). Alternatively, the emitter layer may include a plurality of component layers which emit light of different colors. By means of mixing of the various colors, the result may be the emission of light with a white color impression. Alternatively, it may be the case that a convertor material arranged in the beam path of the primary emission generated by these layers at least partly absorbs the primary radiation and emits a secondary radiation of another wavelength, such that a primary radiation (which is not yet white) gives rise, by the combination of primary radiation and secondary radiation, to a white color impression.

The organic functional layer structure unit 116 may have one or more emitter layers executed as hole transport layer.

In addition, the organic functional layer structure unit 116 may have one or more emitter layers executed as electron transport layer.

An electron transport layer may be formed, for example deposited, atop or above the emitter layer.

The electron transport layer may include or be formed from one or more of the following materials: NET-18; 2,2',2"-(1,3,5-benzenetriyl)-tris(1-phenyl-1H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato-lithium, 4-(naphthalen-1-yl)-3,5-diphenyl-4H-1,2,4-triazole; 1,3-bis[2-(2,2'-bipyridin-6-yl)-1,3,4-oxadiazol-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolato)-4-(phenylphenolato)aluminum; 6,6'-bis[5-(biphenyl-4-yl)-1,3,4-oxadiazol-2-yl]-2,2'-bipyridyl; 2-phenyl-9,10-di(naphthalen-2-yl)anthracene; 2,7-bis[2-(2,2'-bipyridin-6-yl)-1,3,4-oxadiazol-5-yl]-9,9-dimethylfluorene; 1,3-bis[2-(4-tert-butylphenyl)-1,3,4-oxadiazol-5-yl]benzene; 2-(naphthalen-2-yl)-4,7-diphenyl-1,10-phenanthroline; 2, 9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]-phenanthroline; phenyldipyrenylphosphine oxide; naphthalenetetracarboxylic dianhydride or the imides thereof; perylenetetracarboxylic dianhydride or the imides thereof; and substances based on siloles with a silacyclopentadiene unit.

The electron transport layer may have a layer thickness within a range from about 5 nm to about 50 nm, for example within a range from about 10 nm to about 30 nm, for example about 20 nm.

An electron injection layer may be formed atop or above the electron transport layer. The electron injection layer may include or be formed from one or more of the following materials: NDN-26, MgAg, $Cs_2CO_3$, $Cs_3PO_4$, Na, Ca, K, Mg, Cs, Li, LiF; 2,2',2"-(1,3,5-benzenetriyl)-tris(1-phenyl-1H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinatolithium, 4-(naphthalen-1-yl)-3,5-diphenyl-4H-1,2,4-triazole; 1,3-bis[2-(2,2'-bipyridin-6-yl)-1,3,4-oxadiazol-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinato)-4-(phenylphenolato)aluminum; 6,6'-bis[5-(biphenyl-4-yl)-1,3,4-oxadiazol-2-yl]-2,2'-bipyridyl; 2-phenyl-9,10-di(naphthalen-2-yl)anthracene; 2,7-bis[2-(2,2'-bipyridin-6-yl)-1,3,4-oxadiazol-5-yl]-9,9-dimethylfluorene; 1,3-bis[2-(4-tert-butylphenyl)-1,3,4-oxadiazol-5-yl]benzene; 2-(naphthalen-2-yl)-4,7-diphenyl-1,10-phenanthroline; 2, 9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]-phenanthroline; phenyldipyrenylphosphine oxide; naphthalenetetracarboxylic dianhydride or the imides thereof; perylenetetracarboxylic dianhydride or the imides thereof; and substances based on siloles with a silacyclopentadiene unit.

The electron injection layer may have a layer thickness within a range from about 5 nm to about 200 nm, for example within a range from about 20 nm to about 50 nm, for example about 30 nm.

In an organic functional layer structure 112 having two or more organic functional layer structure units 116, 120, the second organic functional layer structure unit 120 may be formed above or alongside the first functional layer structure unit 116. An interlayer structure 118 may be formed between the organic functional layer structure units 116, 120 for electrical purposes.

In various working examples, the interlayer structure 118 may take the form of an intermediate electrode 118, for example according to one of the configurations of the first electrode 110. An intermediate electrode 118 may be electrically connected to an external voltage source. The external voltage source may provide a third electrical potential, for example, at the intermediate electrode 118. However, the intermediate electrode 118 may also not have any external electrical connection, for example in that the intermediate electrode has a floating electrical potential.

In various working examples, the interlayer structure 118 may take the form of a charge carrier pair generation layer structure 118 (charge generation layer CGL). A charge carrier pair generation layer structure 118 may have one or more electron-conducting charge carrier pair generation layer(s) and one or more hole-conducting charge carrier pair generation layer(s). The electron-conducting charge carrier pair generation layer(s) and the hole-conducting charge carrier pair generation layer(s) may each be formed from an intrinsically conductive substance or a dopant in a matrix. The charge carrier pair generation layer structure 118, with regard to the energy level of the electron-conducting charge carrier pair generation layer(s) and the hole-conducting charge carrier pair generation layer(s), should be set up such that a separation of electron and hole can be effected at the interface of an electron-conducting charge carrier pair generation layer with a hole-conducting charge carrier pair generation layer. The charge carrier pair generation layer structure 118 may additionally have a diffusion barrier between adjacent layers.

Each organic functional layer structure unit 116, 120 may have, for example, a layer thickness of not more than about 3 μm, for example a layer thickness of not more than about 1 μm, for example a layer thickness of not more than about 300 nm.

The optoelectronic component 100 may optionally have further organic functional layers, for example disposed atop or above the one or more emitter layer(s) or atop or above the electron transport layer(s). The further organic functional layers may, for example, be internal or external in-/outcoupling structures which further improve the functionality and hence the efficiency of the optoelectronic component 100.

The second electrode 114 may be formed atop or above the organic functional layer structure 112 or optionally atop or above the one or more further organic functional layer structures and/or organic functional layers.

The second electrode 114 may be set up in accordance with one of the configurations of the first electrode 110, in which case the first electrode 110 and the second electrode 114 may be set up in the same or different ways. The second electrode 114 may be set up as an anode, i.e. as a hole-injecting electrode, or as an cathode, i.e. as an electron-injecting electrode.

The second electrically conductive substance may be transparent or translucent. The second electrically conductive substance may be a transparent electrically conductive oxide. The second electrode may be transparent or translucent. The second electrically conductive substance may include or be formed from a metal.

In one configuration, the second electrically conductive substance may include or be formed from a precious metal. In one configuration, the second electrically conductive substance may include or be formed from a semiprecious metal.

The second electrode 114 may have a second electrical connection to which a second electrical potential can be applied. The second electrical potential may be provided by the same energy source as or a different energy source than the first electrical potential and/or the optional third electrical potential. The second electrical potential may be different than the first electrical potential and/or the optional third electrical potential. The second electrical potential may have, for example, such a value that the difference from the first electrical potential has a value within a range from about 1.5 V to about 20 V, for example a value within a range from about 2.5 V to about 15 V, for example a value within a range from about 3 V to about 12 V.

A connection of one of the electrodes 110, 114, may have an electrical contact supply 132 and/or a contact connection structure 134.

The electrical contact supply 132 may, for example, be transparent, translucent or opaque with respect to visible light. The electrical contact supply 132 for example be a multilayer system. The electrical contact supply 132 may include, for example, one or more layer(s) of Mo, Al, Cr, Ag and/or Mg, for example Mo/Al/Mo, Cr/Al/Cr, Ag/Mg, Al.

The contact connection structure 134 may include, for example, a contact connection layer and/or a contact connection film, for example in solderable, bondable or weldable form, for example for an electrically conductive adhesive bond (anisotropic conductive film (ACF) bonding).

The first electrode 110 may be set up so as to be electrically insulated from the second electrode 114, for example by means of an electrical insulation 130. The electrical insulation 113 may, for example, include or be formed from a polyimide. The electrical insulation 130 may be optional in the case of a structured setup of the electrodes 110, 114.

The active substance 136 may be a chemically active substance and/or a physically active substance. In one configuration, the active substance may include a physically active substance and a chemically active substance.

The active substance 136 may be introduced into the OLED as a solid, for example as a solid oxidizing agent; and/or as nanoparticles—illustrated in FIG. 1A as nanoparticles 136 on the second electrode 114.

A chemically active substance 136 can generate electrically nonconductive products in a redox reaction. This allows, for example, a short circuit in the optoelectronic component 100 to be isolated. As a result, it is possible to automatically electrically insulate a particle-contaminated site 138 of an optoelectronic component 100 on/shortly before the occurrence of a short circuit. This can suppress further flow of current in the particle-contaminated site 138.

The dimension of the electrically insulated particle-contaminated site may be so small that it is imperceptible as a dark spot by eye or is obliterated by means of an outcoupling structure. For example, a scattering structure can surround the dark spot laterally in the beam path of the electromagnetic radiation. The dimension can be adjusted, for example, by means of the chemical reactivity and/or the number of available reaction states of the chemically active substance, for example the number of oxidation states.

In one working example, the active substance may be set up such that the active substance and/or the converted electrically nonconductive substance 140 are/is transparent or translucent with respect at least to one visible light. As a result, the electrically insulated particle-contaminated site, for example, is invisible in the off state.

The active substance may be dielectric, electrically nonconductive and/or electrically conductive. In one configuration, the chemically active substance may become dielectric or electrically nonconductive after the first electrically conductive substance and/or the second electrically conductive substance have/has been chemically converted.

In one configuration, the chemically active substance 136 may be an oxidizing agent. The oxidizing agent may have two or more oxidation states. The chemically active substance may include or be formed from one of the following substances or substance components: manganese, osmium, copper, vanadium, sodium, titanium, potassium, permanganate, dichromate, percarbonate, oxide, nitride, oxynitride; for example manganese oxide, titanium oxide, vanadium oxide, copper oxide, osmium oxide; amine oxides, for example N-methylmorpholine N-oxide.

The chemically active substance can chemically react with various substances in an electrically conductive layer, for example at different temperatures, for example in the case of an electrode or an electrically conductive layer of the organic functional layer structure having several electrically conductive substances.

In addition, the optoelectronic component may include different chemically active substances 136 which can chemically convert different electrically conductive substances and/or chemically activate them under different conditions.

In one configuration, the chemically active substance may be a reducing agent. The reducing agent may have two or more reduction states.

In various working examples, the chemically active substance includes or is formed from a metal oxide, a metal nitride and/or a metal oxynitride. The metal oxide, the metal nitride and/or the metal oxynitride have various oxidation states or reduction states.

At various temperatures, the metal oxide, the metal nitride and/or the metal oxynitride can release oxygen or nitrogen and thus act as oxidizing agent or reducing agent. The oxygen or nitrogen released can react chemically with an electrically conductive substance in the optoelectronic component and convert it to an electrically nonconductive, electrically insulating or electrically nonconductive substance or region.

In one working example, the metal oxide, the metal nitride and/or the metal oxynitride, after the chemical activation, can react directly with the electrically conductive substance and convert it chemically.

In one working example, the metal oxide, the metal nitride and/or the metal oxynitride, after the release of oxygen or nitrogen, can react directly with the electrically conductive substance and convert it chemically.

The active substance may be set up so as to be activatable such that the first electrically conductive substance and/or the second electrically conductive substance can be converted after activation of the active substance.

In one configuration, the active substance may be set up such that the conversion is thermally activatable. The thermal activation can be effected by means of heating. The chemically active substance may be chemically activatable within a temperature range from about 20° C. to about 1500° C., for example at a temperature greater than 100° C.

For example, the chemically active substance may include or be formed from $MnO_2$.

When heated to more than 450° C., $MnO_2$ reacts with release of oxygen to give manganese(III) oxide ($Mn_2O_3$):

$$4\ MnO_2 \xrightarrow{\Delta T} 2\ Mn_2O_3 + O_2 \quad (I)$$

When heated to more than 600° C., $MnO_2$ reacts with release of oxygen to give manganese(II, III) oxide ($Mn_3O_4$):

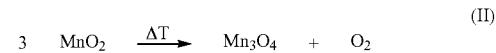

$$3\ MnO_2 \xrightarrow{\Delta T} Mn_3O_4 + O_2 \quad (II)$$

The oxygen formed in (I) and (II) can react further chemically with the electrically conductive substances in the organic functional layer structure 112 and/or the electrodes 110, 114, for example convert them to electrically nonconductive and/or dielectric substances.

Manganese oxide cannot release any oxygen under operating conditions or storage conditions of the optoelectronic component 100. Oxygen can be released at elevated temperature. The oxygen released can react chemically, for example, with the substance of the second electrode, for example aluminum, and convert it to an electrically nonconductive substance or region, for example $AlO_x$. The chemically active substance may be set up such that the chemical activation and chemical conversion of an electrically conductive substance can be effected before, for example, a short circuit can occur. The chemically reacted chemically active substance may be electrically nonconductive, for example dielectric.

In the case of $MnO_x$, oxygen can be released to an increasing degree with rising temperature and hence the conversion, for instance in the event of a short circuit, can be accelerated, meaning that the formation of the electrical insulator can be accelerated by means of higher temperatures.

The chemically active substance, for example $MnO_x$, may be formed in a layer in the electrically active region 106 in the current path of the first electrode 110 and/or the second electrode 114 (illustrated in FIG. 1A; see also FIGS. 4A-4F), for example atop, above and/or below the second electrode 114.

The layer including/composed of active substance may have a thickness within a range from about 1 nm to about 2 μm.

The lateral extent of the layer including/composed of active substance 136 may be matched to the configuration of the optoelectronic component 100. For example, the active substance 136 may be formed to an increased extent or only in regions particularly prone to particle contamination, for example in the geometric edge region; and/or in which information is to be presented by means of the at least one active substance, for example a written message, a pictogram, a symbol and/or an ideogram by means of the conversion.

In one working example, the active substance may take the form of a layer, i.e. have no granularity and be formed over the (full) flat area; and/or take the form of nanoparticles, for example of a nanoparticle layer, for example having a thickness of less than 1 nm up to about 2 μm. For example, nanoparticles of a first active substance may be distributed in a layer of a second active substance (without or with different granularity). The first active substance may be the same as or different than the second active substance. For example, the first active substance may be a chemically active substance and the second substance a physically active substance. By means of the granularity, i.e. the particle size of the active substance, it is possible to alter the size of the surface area according to the molar amount and hence the reaction rate upon activation of the active substance.

The chemically active substance may be set up and/or selected such that it can chemically convert differences materials, for example the abovementioned substances in the first electrode 110, the second electrode 114 and/or the organic functional layer structure 112, for example Al, Ag, Mg.

In one configuration, the active substance 136 may be set up such that the conversion is activatable by means of electromagnetic radiation, a magnetic field, an electrical field and/or an electrical current.

The active substance 136 may be arranged with respect to the first electrode 110 and/or the second electrode 114 such that the first electrode 110 and/or the second electrode 114 activate(s) the active substance, for example in that the active substance chemically reacts with the first electrically conductive substance and/or the second electrically conductive substance on physical contact.

The active substance 136 may be arranged with respect to the first electrode 110 and/or the second electrode 114 such that the active substance 136 is self-passivating with respect to the first electrode 110 and/or the second electrode 114.

The nonconductive substance 140 may be transparent or translucent with respect to visible light.

In one configuration, the physically active substance may be fusible, for example be or include a thermoplastic.

In one configuration, the physically active substance may be agglomeratable, for example thermally agglomeratable.

The second barrier layer 108 may be formed atop the second electrode 114.

The second barrier layer 108 can also be referred to as a thin-film encapsulation (TFE). The second barrier layer 108 may be set up according to one of the configurations of the first barrier layer 104.

In addition, it should be pointed out that it is also possible to dispense entirely with a second barrier layer 108 in various working examples. In such a configuration, the optoelectronic component 100 may have, for example, a further encapsulation structure which can make a second barrier layer 108 optional, for example a cover 124, for example a cavity glass encapsulation or metallic encapsulation. In addition, in various working examples, one or more in-/outcoupling layers may also be formed in the optoelectronic component 100, for example an external outcoupling film atop or above the carrier 102 and/or the cover 124 (not shown) or an internal outcoupling layer (not shown) in the layer cross section of the optoelectronic component 100. The in-/outcoupling layer may have a matrix and scattering sites distributed therein, the mean refractive index of the in-/outcoupling layer being greater or less than the mean refractive index of the layer from which the electromagnetic radiation is provided. In addition, in various working examples, it is additionally possible to provide one or more antireflective layers (for example combined with the second barrier layer 108) in the optoelectronic component 100.

In various working examples, a cohesive bonding layer 122 may be provided atop or above the second barrier layer 108, for example composed of an adhesive or a lacquer. By means of the cohesive bonding layer 122, cohesive bonding, for example adhesive bonding, of the cover 124 on the second barrier layer 108 is possible.

A cohesive bonding layer 122 composed of a transparent material may include, for example, particles which scatter electromagnetic radiation, for example light-scattering particles. This allows the cohesive bonding layer 122 to act as a scattering layer and lead to an improvement in color angle distortion and outcoupling efficiency.

Light-scattering particles provided may be dielectric scattering particles, for example composed of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide or titanium oxide. Other particles may also be suitable, provided that they have a refractive index different than the effective refractive index of the matrix of the cohesive bonding layer 122, for example air bubbles, acrylate or hollow glass beads. In addition, it is possible to provide, for example, metallic nanoparticles, or metals such as gold, silver, iron nanoparticles or the like, as light-scattering particles.

The cohesive bonding layer 122 may have a layer thickness of greater than 1 μm, for example a layer thickness of several μm. In various working examples, the cohesive bonding layer 122 may include or be a lamination adhesive.

The cohesive bonding layer 122 may be set up such that it includes an adhesive having a refractive index less than the refractive index of the cover 124. Such an adhesive may, for example, be an adhesive of low refractive index, for example an acrylate having a refractive index of about 1.3. However, the adhesive may also be an adhesive of high refractive index, including, for example, non-scattering particles of high refractive index and having a layer thickness-averaged refractive index corresponding roughly to the mean refractive index of the organic functional layer structure 112, for example within a range from about 1.7 to about 2.0. In addition, it is possible to provide several different adhesives which form an adhesive layer sequence.

In various working examples, it is also possible for an electrically insulating layer (not shown) to be applied or to be between the second electrode 114 and the cohesive bonding layer 122, for example SiN, for example having a layer thickness within a range from about 300 nm to about 3.5 µm, for example having a layer thickness within a range from about 500 nm to about 1 µm, in order to protect electrically unstable materials, for example during a wet-chemical operation.

In various working examples, a cohesive bonding layer 122 may be optional, for example if the cover 124 is being formed directly atop the second barrier layer 108, for example a cover 124 made from glass which is formed by means of plasma spraying.

Atop or above the electrically active region 106 may additionally be disposed what is called a getter layer or getter structure, for example a laterally structured getter layer (not shown).

The getter layer may include or be formed from a material that absorbs and binds substances harmful to the electrically active region 106. A getter layer may, for example, include or be formed from a zeolite derivative. The getter layer may be translucent, transparent or opaque and/or be impermeable with respect to the electromagnetic radiation which is emitted and/or absorbed in the optically active region. The getter layer may have a layer thickness of greater than about 1 µm, for example a layer thickness of several µm.

In various working examples, the getter layer may include a lamination adhesive or be embedded in the cohesive bonding layer 122.

A cover 124 may be formed atop or above the cohesive bonding layer 122. The cover 124 may be cohesively bonded to the electrically active region 106 by means of the cohesive bonding layer 122 and protect it from harmful substances. The cover 124 may, for example, be a glass cover 124, a metal foil cover 124 or a sealed polymer film cover 124. The glass cover 124 may be cohesively bonded to the second barrier layer 108 or the electrically active region 106 in the geometric edge regions of the organic optoelectronic component 100, for example by means of frit bonding (glass frit bonding/glass soldering/seal glass bonding) by means of a conventional glass solder.

The cover 124 and/or the cohesive bonding layer 122 may have a refractive index (for example at a wavelength of 633 nm) of 1.55.

In various embodiments, a method 200 of producing an optoelectronic component 100 is provided—illustrated in FIG. 2.

The optoelectronic component 100 may take the form of a flat component. The optoelectronic component 100 may take the form of an organic optoelectronic component. The optoelectronic component 100 may take the form of a light-emitting diode, a photodetector and/or a solar cell.

The method 200 may include forming 202 of a first electrode 110 with a first electrically conductive substance. The first electrically conductive substance may be transparent or translucent. The first electrically conductive substance may, for example, be a transparent electrically conductive oxide. The first electrode may be transparent or translucent; see also the further working examples above.

In addition, the method 200 may include forming 204 of a second electrode 114 with a second electrically conductive substance. The second electrode 114 may be formed atop, above or alongside the first electrode 110. The second electrically conductive substance may be transparent or translucent. The second electrically conductive substance may be a transparent electrically conductive oxide. The second electrode may be transparent or translucent. The second electrically conductive substance may include or be formed from a metal. The second electrically conductive substance may include or be formed from a precious metal. The second electrically conductive substance may include or be formed from a semiprecious metal.

In addition, the method 200 may include forming 206 of at least one active substance 136.

The active substance may be chemically active and/or physically active. The active substance may be transparent or translucent with respect to at least one visible light. The active substance may be dielectric, electrically nonconductive or electrically conductive. In one working example, the active substance may become dielectric or electrically non-conductive after the first electrically conductive substance and/or the second electrically conductive substance have/has been chemically converted. The active substance may be set up according to one of the working examples described above or below.

The active substance may be formed within a current path of the first electrode 110 and/or the second electrode 114.

In one working example of the method 200, the forming 206 of at least one active substance 136 may further include arrangement of nanoparticles, the nanoparticles including or being formed from the active substance.

The nanoparticles may have a core 302 and a shell 304. The shell 304 may be formed such that the core 302 is surrounded by the shell 304. As a result, the shell 304 can shield a core including a chemically active substance 136 from a chemical reaction. The nanoparticles may be formed such that the shell 304 can be thermally detached from the core 302, in such a way that the core 302 can be thermally exposed.

In one working example, the active substance 136 can be formed by distributing the active substance 136 in the first electrode 110 in such a way that the first electrode 110 includes the active substance. In one working example, the active substance 136 can be formed by distributing the active substance 136 in the second electrode 114 in such a way that the second electrode 114 includes the active substance.

In one configuration of the method, the method 200 may further include forming of a layer structure 112, for example an organic functional layer structure 112, the layer structure 112 being formed between the first electrode 110 and the second electrode 114 and including the active substance 136. The active substance 136 may be distributed in the layer structure 112 in such a way that the layer structure includes the active substance 136. The forming of the layer structure 112 may include forming of a layer, the layer including or being formed from the active substance 136. In one working example of the method 200, the active substance may be formed atop or above the first electrode 110 and/or the second electrode 114. In one working example of the method 200, the active substance may be arranged in two or more layers atop or above the first electrode 110 and/or the second electrode 114. In one working example of the method 200, the active substance 136 may take the form of an interlayer in the first electrode 110 and/or in the second electrode 114.

The active substance 136 may be set up such that it can convert the first electrically conductive substance and/or the second electrically conductive substance to an electrically nonconductive substance or region 140, for example chemically and/or physically.

In one working example of the method 200, the active substance 136 may be set up so as to be activatable, such that the first electrically conductive substance and/or the second electrically conductive substance can be converted after activation of the active substance 136. The activation of the conversion and/or the activation of the propensity of the active substance for conversion can be effected by means of at least one of the following methods: thermal activation, for example by means of heating, for example to a temperature within a temperature range from about 20° C. to about 1500° C., for example at a temperature greater than 100° C.; by means of incidence of electromagnetic radiation, for example UV radiation and forming of chemical free radicals, of infrared and/or microwave radiation for thermal activation; by means of incidence of an (alternating) magnetic field, for example by means of magnetically induced heating; by means of incidence of an electrical field, for example by means of diffusion of polar and/or polarized particles, for example nanoparticles; by means of an electrical current, for example heating induced by an ohmic resistance; by means of physical contact of the first electrically conductive substance and/or the second electrically conductive substance with the chemically active substance, for example by removal of a chemically shielding shell 304 of nanoparticles and exposure of the core 302 of the nanoparticles composed of a chemically active substance.

In one working example, the chemically active substance may be set up with respect to the first electrode 110 and/or the second electrode 114 such that the chemically active substance 136 is self-passivating with respect to the first electrode 110 and/or the second electrode 114. Self-passivation may, for example, be an automatic interruption of an electrical connection on exceedance of a critical temperature, in that the critical temperature induces the conversion of the electrically conductive substance to an electrically nonconductive substance or region. For such self-passivation, the chemically active substance 136 should be physically close to the first electrode 110 and/or the second electrode 114. The active substance 136 should be set up and arranged in the flow path such that the electrically nonconductive substance 140 interrupts, reduces and/or deflects at least one current path between the first electrode 110 and the second electrode 114.

The electrically nonconductive substance 140 formed from the conversion of the first electrically conductive substance and/or the second electrically conductive substance may be transparent or translucent with respect to visible light.

In various working examples, a method of operating an optoelectronic component 100 in one of the above-detailed configurations is provided. The method may include activating the active substance in such a way that the at least one active substance converts an electrically conductive substance in a current path of the first electrode and/or the second electrode to an electrically nonconductive substance or region.

The activation may include application of an overvoltage to the optoelectronic component 100. In this way, it is possible to condition the optoelectronic component 100 by converting particle-contaminated sites 138 in the optoelectronic component 100 in the proximity of active substance to electrically nonconductive regions, for example by chemical conversion. An overvoltage is a voltage higher than the operating voltage of the optoelectronic component, for example in the form of a brief voltage pulse having a high pulse height, for example a voltage pulse having a pulsewidth within a range from about 10 µs to about 100 ms and a pulse height within a range from about 200 V to about 10 kV.

The activation may include irradiation of the active substance 136, for example with electromagnetic radiation, an electrical field and/or a magnetic field.

In one configuration of the method, the irradiation of the active substance 136 can be effected in structured form, for example in order to present information by means of the converted electrically nonconductive region, for example after the encapsulation structure 126 on the electrically active region has been formed.

This allows the converted region of the optoelectronic component 100, in the optically active and/or optically inactive state, to have a different appearance than the unstructured region, for example a color and/or brightness contrast. This makes it possible to show, in the light-emitting area of an optoelectronic component 100, for example, a written message, a symbol, an ideogram and/or a pictogram.

Figure 3A:
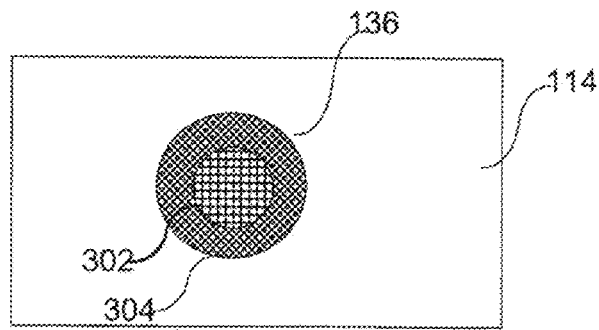
FIGS. 3A-3C show schematic diagrams of a chemically active substance according to various working examples.
Figure 3B:
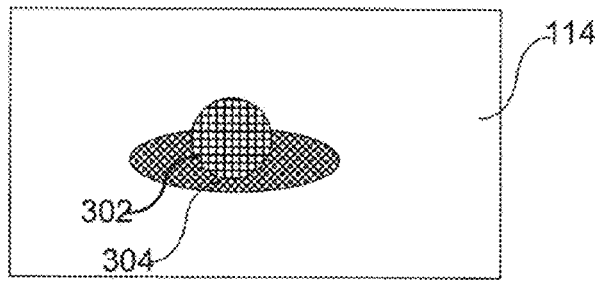
Figure 3C:
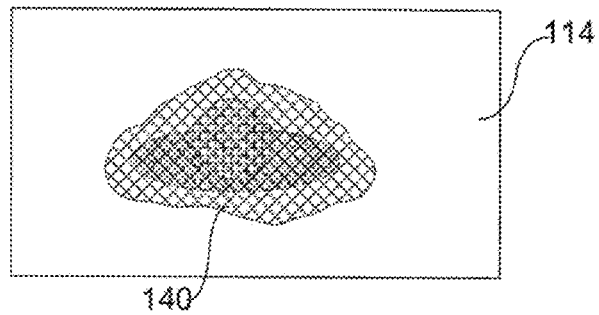

In one configuration, the optoelectronic component 100 may include nanoparticles 136—illustrated in FIGS. 3A-3C for nanoparticles 136 in the second electrode 114. The nanoparticles may include or be formed from the chemically active substance. The nanoparticles 136 may have a core 302 and a shell 304—illustrated in FIG. 3A. The core 302 may be surrounded by the shell 304. The core 302 may include or be formed from the chemically active substance.

The shell 304 may be set up to shield the chemically active substance from a chemical reaction, for example from a chemical reaction with the substance of the second electrode 114.

The nanoparticles 136 may be set up such that the shell 304 can be thermally detached from the core 302, in such a way that the core 302 can be thermally exposed—illustrated in FIG. 3B. The thermal exposure allows chemical reaction of the chemically active substance 136 with the second electrically conductive substance of the second electrode 114, for example in that the chemically active substance 136 comes into physical contact with the surrounding electrically conductive substance. This allows the electrically conductive substance to be converted to an electrically nonconductive substance or region 140—illustrated in FIG. 3C. For example, the chemically active substance may oxidize the electrically conductive substance of the second electrode. This allows the chemically active substance to interrupt and/or deflect current flow in the electrically conductive substance.

This makes it possible, for example, for the current flow through a particle-contaminated site 138 in the optoelectronic component 100 to be interrupted, or the current flow to be deflected around the particle-contaminated site 138. In the case of a particle-contaminated site 138, an electrical short circuit can occur, which can generate heat in the particle-contaminated site 138.

A particle-contaminated site 138 can be electrically insulated by means of chemical reactions even at low temperatures by means of the active substance, for example in the form of single-component nanoparticles and/or multicomponent nanoparticles. As a result, it is no longer possible for electrical current to flow through the particle-contaminated site 138. Thus, no further energy is supplied to the particle-contaminated site 138, and a spontaneous failure of the optoelectronic component can be avoided.

Single-component nanoparticles may be formed from the chemically active substance and not have any shell 304 or envelope 304. Single-component nanoparticles composed of chemically active substance can thus have only a chemically active core 302. The chemically active core 302 or the single-component chemically active nanoparticles 136 may include a metal oxide, a metal nitride or a metal oxynitride having several oxidation states and/or several reduction states, for example $MnO_x$ or $TiO_x$.

Multicomponent nanoparticles may, for example, be core-shell nanoparticles. The multicomponent nanoparticles may have a chemically inactive shell 304, for example a physically active shell 304; and/or one or more chemically active regions, for example a chemically active core 302 and/or one or more chemically active shells (not illustrated). The chemically active core 302 of the multicomponent chemically active nanoparticles 136 may include a metal oxide, a metal nitride or a metal oxynitride having several oxidation states and/or several reduction states as core 302, for example $MnO_x$ or $TiO_x$. As chemically active shell or chemically active envelope, the nanoparticles may include a substance according to one of the configurations of the substances in the core 302. As chemically inactive shell 304 or chemically inactive envelope 304 or physically active envelope 304, the nanoparticles may include or be formed from a low-melting, chemically inert substance, for example an alkyl thiol, for example dithioerythritol (melting point: 40° C. to 80° C.), hexadecanethiol (melting point 20° C.); a linear low-density polyethylene (LLD-PE) (melting temperature 40° C. to 120° C., can melt from 30° C. in the event of temperature increases); block copolymers, a thermoplastic—can melt on exceedance of a particular temperature, for example polypropylene from 160° C.; a thermoset—can break down on exceedance of a certain temperature.

The single-component and multicomponent nanoparticles may have a diameter within a range from about 1 nm to about 100 nm.

In various working examples, the active substance 136 may take the form of particles. The particles may be formed in the electrically active region 106 (see above). The particles including at least one active substance may have an optical effect.

In one working example, the particles having at least one active substance may include or be formed from an inorganic substance or an inorganic substance mixture.

In one working example, at least one type of particles having at least one active substance may include or be formed from a substance or a substance mixture or a stoichiometric compound from the group of substances: $MnO_x$, $VO_x$, $CuO_x$, $OsO_x$, $TiO_x$, $CeO_x$, $BiO_x$, $ZnO_x$, $SnO_x$, $AlO_x$, $SiO_x$, $YO_x$, $ZrO_x$.

In one working example, the particles may take the form of nanoparticles; see the description above.

In one working example, the particles may have a curved surface, for example in a similar or identical manner to an optical lens.

In one working example, the particles may have one of the following geometric forms and/or a portion of one of the following geometric forms: spherical, aspherical, for example prismatic, ellipsoidal, hollow, compact, platelet-shaped or rod-shaped.

In one working example, the particles may have a mean particle size within a range from about 0.0001 µm to about 10 µm, for example within a range from about 0.1 µm to about 1 µm.

In one working example, the particles atop or above the carrier 102 in a layer may include a sheet having a thickness of about 0.1 µm to about 100 µm.

In one working example, the particles may form several sheets one on top of another atop or above the carrier 102, in which case the individual sheets may be different.

In one working example, in the sheets of the particles, the mean size of the particulate particles may decrease from the surface of the substrate.

In one working example, the individual sheets of particles may have a different mean size of the particulate particles and/or have a different transmission of electromagnetic radiation in at least one wavelength range, for example with a wavelength of less than about 400 nm.

In one working example, the individual sheets of particles may have a different mean size of the particles and/or a different refractive index for electromagnetic radiation.

In one working example, the particles may be set up as scattering particles for electromagnetic radiation, for example light, in which case the particles have a different refractive index than the surrounding layer, for example a difference in the refractive index of the scattering particles from the refractive index of the surrounding layer of greater than about 0.05, and a diameter corresponding to about the size of the wavelength of the electromagnetic radiation to be scattered. The scattering effect may affect electromagnetic radiation which is emitted or absorbed by the organic functional layer structure, for example in order to increase light outcoupling or light incoupling.

In one working example, one kind of particles can be set up as a dye. The substance of the particles can absorb, for example, electromagnetic radiation within a wavelength range of no application-specific relevance, for example greater than about 700 nm. This allows the visual appearance of the optoelectronic component to be altered, for example the optoelectronic component 100 to be colored, without worsening the efficiency in any region of no technical relevance for the use of the optoelectronic component.

In one working example, one kind of particles can be set up as a kind of UV-absorbing addition.

In one working example, one kind of particles can be set up as a wavelength-converting addition, for example as a luminophore.

In one working example, one kind of particles in the coupling layer can be set up as getters.

In one working example, the particles can scatter electromagnetic radiation, absorb UV radiation, convert the wavelength of electromagnetic radiation, color the optoelectronic component and/or bind harmful substances.

Particles which can, for example, scatter electromagnetic radiation and not absorb any UV radiation may, for example, include or be formed from $AlO_x$, $SiO_x$, $YO_x$ or $ZrO_x$.

In one working example, the layer including chemically active substance may be structured, for example topographically, for example laterally and/or vertically; for example by means of a different physical composition of the layer including chemically active substance, for example laterally and/or vertically, for example with a different local concentration of chemically active substance.

In one working example, the concentration of the of chemically active substance in at least one region may be less or greater than in the optically active region.

In one working example, the active substance 136 may be set up and arranged in the current path such that the electrically nonconductive substance 140 interrupts, reduces and/or deflects at least one current path between the first electrode 110 and the second electrode 114—some working examples are illustrated in FIG. 1A, FIGS. 4A-4F—for better clarity without the encapsulation structure.

An active substance 136 may be distributed, embedded and/or arranged in any of the layers and/or in any region of the electric active region 106.

The optoelectronic component 100 may include several different active substances, for example chemically active substances and/or physically active substances.

The plurality of active substances may be matched, for example, to the respective material composition of the functional layer surrounding the respective active substance in the electrically active region 106.

The active substance or the plurality of active substances may be disposed in one or more layers in an optoelectronic component 100, for example in one or more layers of the electrically active region 106.

The active substance 136 or the plurality of active substances may be in different forms in the optoelectronic component, for example in the form of nanoparticles including active substance, in the form of a layer composed of active substance and/or in the form of a layer including active substance.

In one working example, the active substance 136 may be distributed in the first electrode 110 in such a way that the first electrode 110 includes the chemically active substance 136. In one working example, the active substance 136 may be distributed in the second electrode 114 in such a way that the second electrode 114 includes the active substance 136 (illustrated in FIG. 4A and FIG. 4F). For example, an electrode 110, 114 may be formed from a substance mixture of active substance 136 and electrically conductive substance of the electrode (illustrated in FIG. 4F), for example as a mixture of Al and $MnO_x$, for example by introducing $MnO_x$ directly into the Al, for example into an aluminum paste for formation of Al. The mixture including electrically conductive substance and active substance 136 for formation of one of the electrodes 110, 114 is possible in various concentrations of the active substance. For example, it is possible for various concentrations to be provided in laterally and/or vertically different regions of the optoelectronic component 100, for example within a range from about 5% by volume to about 50% by volume based on the total volume of the electrode, for example within a range from about 10% by volume to about 30% by volume, for example within a range from about 15% by volume to 25% by volume. In addition, various active substances may be present in the mixture.

Figure 4A:
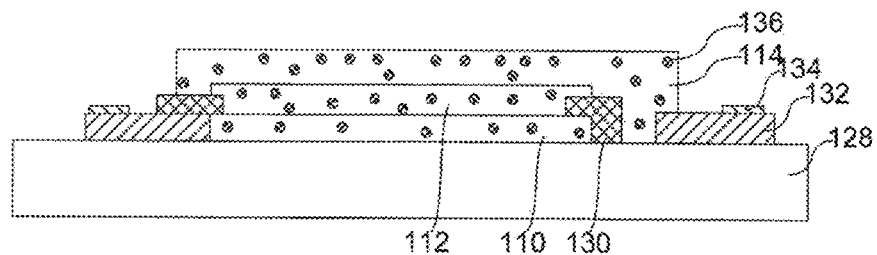
FIGS. 4A-4F show schematic diagrams of optoelectronic components according to various working examples.
Figure 4B:
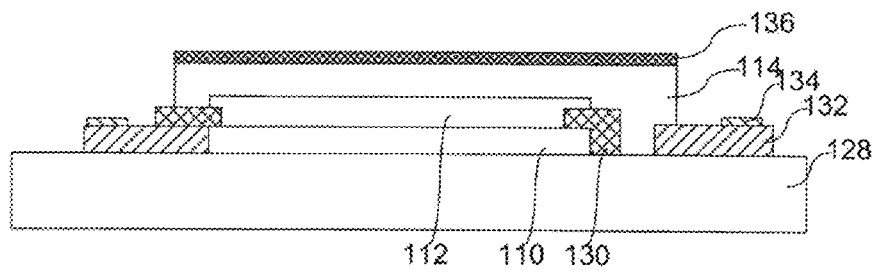
Figure 4C:
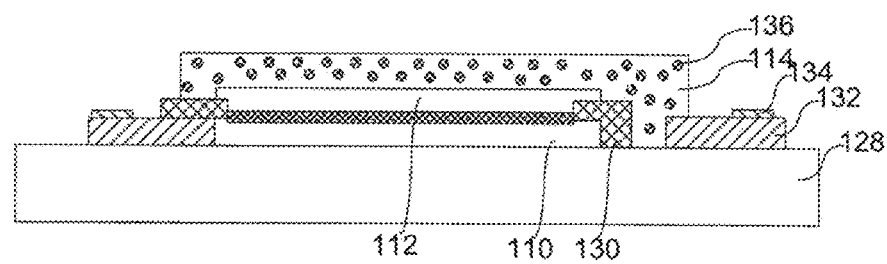

In one working example, the active substance 136 may be formed atop or above the first electrode 110 (illustrated in FIG. 4B, FIG. 4D and FIG. 4E) and/or the second electrode 114 (illustrated in FIG. 4C).

Figure 4D:
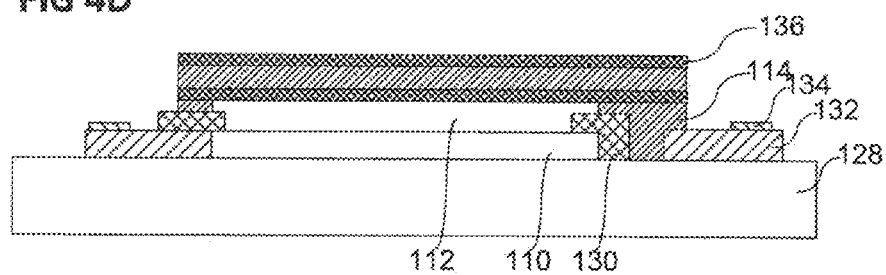
Figure 4E:
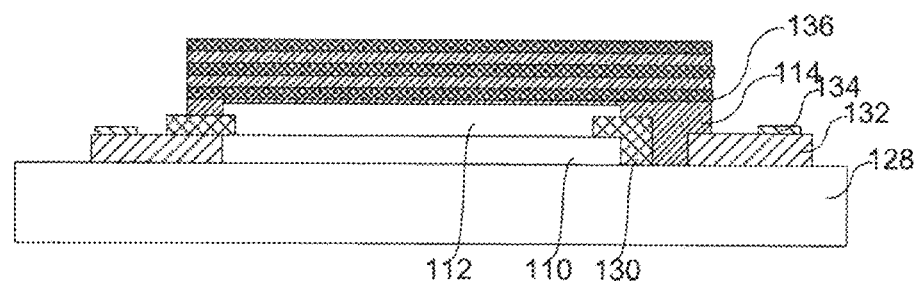
Figure 4F:
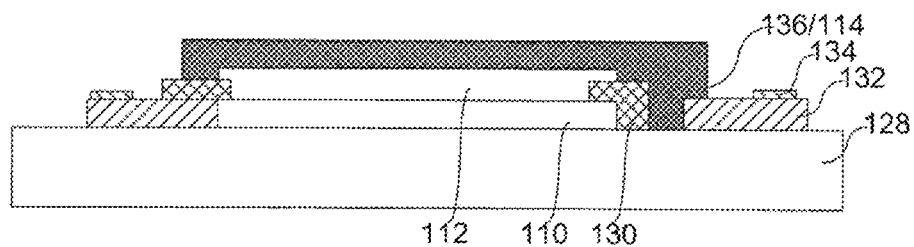
Figure 5:
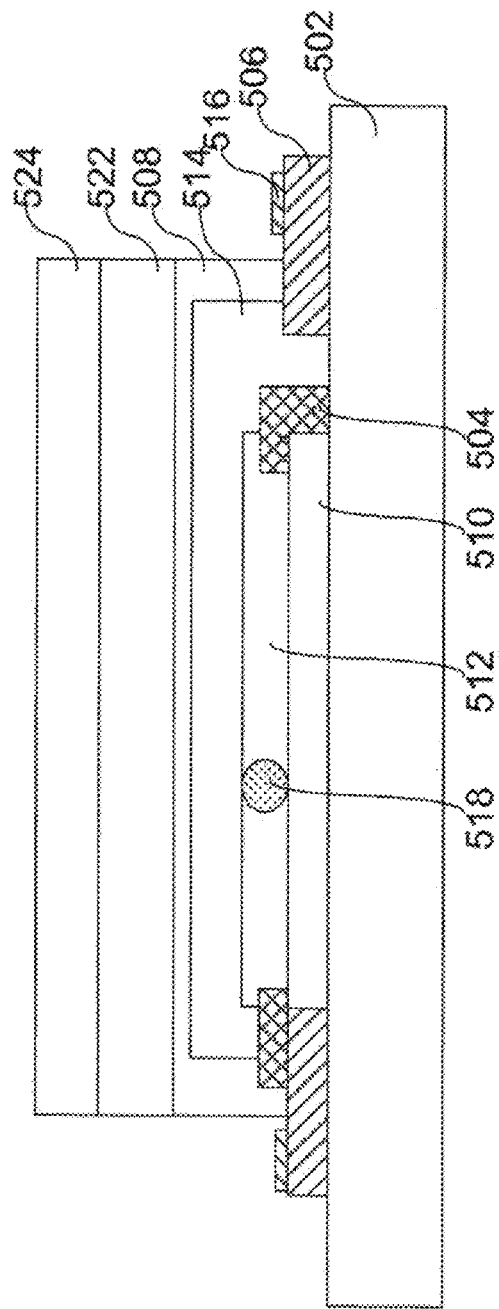
FIG. 5 shows a conventional optoelectronic component.

In one working example, active substance 136 may be disposed in two or more layers atop or above the first electrode 110 and/or second electrode 114 (illustrated in FIG. 4D and FIG. 4E). In one working example, active substance 136 may take the form of an interlayer in the first electrode 110 and/or in the second electrode 114 (illustrated in FIG. 4E).

In one working example, the optoelectronic component 100 may also have a layer structure, for example an organic functional layer structure 112, wherein the layer structure is formed between the first electrode 110 and the second electrode 114 and includes active substance 136 (illustrated in FIG. 4A). In one working example, active substance 136 may be distributed in the layer structure 112 in such a way that the layer structure 112 includes active substance 136 (illustrated in FIG. 4A). In one working example, the layer structure 112 may include a layer including or formed from chemically active substance 136.

In one working example, the active substance 136 may take the form of particles distributed as a layer and/or in a layer (illustrated in FIG. 4C), for example as a layer of nanoparticles including active substance.

In various working examples, a layer composed of or including active substance 136 may be formed on an electrode 110, 114 or as a substrate for an electrode 110, 114, for example by means of physical vapor deposition, cathodic atomization (sputtering) and/or printing.

The active substance 136 may be formed in one or more layer(s) in various planes of the optoelectronic component 100, for example atop and/or within the organic functional layer structure 112 and/or atop, above and/or within the electrodes 110, 114, for example as multilayer systems atop and/or within an electrode 110, 114; and/or as mixtures of chemically active substance and a substance in the organic functional layer structure and/or an electrode 110, 114.

In various embodiments, an optoelectronic component, a method of operating an optoelectronic component and a method of producing an optoelectronic component are provided, by which it is possible to reduce spontaneous failures of optoelectronic components, such that the replacement rate of defective lighting means can be reduced.

As a result, it is possible to prevent or reduce early failures of optoelectronic components.

In addition, the yield in the production of optoelectronic components can be increased.

In addition, the testing intensity for potential defect sites can be reduced, ideally with no need for any test procedure.

In addition, the necessary cleanroom class for the production of the optoelectronic components can be reduced, which can achieve cost savings.

In addition, the optoelectronic components can be conditioned by eliminating short-circuit areas by baking/reaction. This enables an improvement in quality control, for example by means of a preselection improved with reduced slippage.

In addition, a chemically active substance, for example as an oxidizing agent, in solid form as nanoparticles or as addition in the case of formation of layers of the optoelectronic component, can improve processing—in contrast to oils or pastes in PVD processes, for example. Thus, breaking of the vacuum is optional. It is thus possible to enable a homogeneous process flow.

In addition, the nanoparticles including chemically active substance enable a very rapid reaction in the OLED layers without impairing the visual impression of the optoelectronic component. It is thus possible to very greatly increase the total reactive surface area.

In addition, with the nanoparticles including the chemically active substance, a greater material variety of potential oxidizing agents is possible. Also possible in this way are those agents which would react immediately with the corresponding environment without the nanoparticle shell. The reaction of the chemically active substance can thus be induced, for example, by melting temperature/breakdown temperature of the shell.

In addition, the nanoparticles including chemically active substance can be introduced into various OLED layers without optical disruption, or else be so large that they intentionally have an optical effect. For example, the nanoparticles may have a color-changing effect, a scattering effect, a mirror effect and/or an attenuating effect.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component comprising:
a first electrode having a first electrically conductive substance,
a second electrode having a second electrically conductive substance, and
at least one chemically active substance, and nanoparticles, wherein the nanoparticles have a core and a shell, wherein the core is surrounded by the shell, wherein the core includes or is formed from the chemically active substance,
wherein the chemically active substance is formed within a current path of the first electrode and/or the second electrode; and
wherein the chemically active substance is set up to convert the first electrically conductive substance and/or the second electrically conductive substance to an electrically nonconductive substance or region.

2. The optoelectronic component as claimed in claim 1, wherein the chemically active substance is an oxidizing agent.

3. The optoelectronic component as claimed in claim 1, wherein the shell is set up to shield the chemically active substance from a chemical reaction.

4. The optoelectronic component as claimed in claim 1, wherein the shell includes a physically active substance.

5. The optoelectronic component as claimed in claim 1, wherein the chemically active substance is set up so as to be activatable, in such a way that the first electrically conductive substance and/or the second electrically conductive substance can be converted after activation of the chemically active substance.

6. The optoelectronic component as claimed in claim 1, wherein the chemically active substance is distributed in the first electrode and/or the second electrode such that the first electrode and/or the second electrode include(s) the chemically active substance.

7. The optoelectronic component as claimed in claim 1, wherein the optoelectronic component takes the form of a light-emitting diode, a photodetector and/or a solar cell.

8. A method of producing an optoelectronic component, the method comprising:
forming a first electrode having a first electrically conductive substance,
forming a second electrode having a second electrically conductive substance, the second electrode being formed above the first electrode;
forming at least one chemically active substance, and forming nanoparticles, wherein the nanoparticles have a core and a shell, wherein the core is surrounded by the shell, wherein the core includes or is formed from the chemically active substance,
wherein the chemically active substance is formed within a current path of the first electrode and/or the second electrode; and
wherein the chemically active substance is set up to convert the first electrically conductive substance and/or the second electrically conductive substance to an electrically nonconductive substance or region.

9. A method of operating an optoelectronic component, wherein the optoelectronic component comprises:
a first electrode having a first electrically conductive substance,
a second electrode having a second electrically conductive substance, and
at least one chemically active substance, and
nanoparticles, wherein the nanoparticles have a core and a shell, wherein the core is surrounded by the shell, wherein the core includes or is formed from the chemically active substance,
wherein the chemically active substance is formed within a current path of the first electrode and/or the second electrode; and
wherein the chemically active substance is set up to convert the first electrically conductive substance and/or the second electrically conductive substance to an electrically nonconductive substance or region;
including the method comprising:
activating the chemically active substance in such a way that the at least one chemically active substance converts an electrically conductive substance in the current path of the first electrode and/or the second electrode to an electrically nonconductive substance or region.

10. The method as claimed in claim 9,
wherein the activation includes application of an overvoltage to the optoelectronic component.

11. The method as claimed in claim 9,
wherein the activation includes irradiation of the chemically active substance.

12. The method as claimed in claim 11,
wherein the irradiation of the chemically active substance is effected in a structured manner.

* * * * *